(12) United States Patent
Fujiyoshi et al.

(10) Patent No.: US 8,866,093 B2
(45) Date of Patent: Oct. 21, 2014

(54) DETECTION DEVICE MANUFACTURING METHOD, DETECTION DEVICE, AND DETECTION SYSTEM

(75) Inventors: Kentaro Fujiyoshi, Kumagaya (JP); Chiori Mochizuki, Sagamihara (JP); Minoru Watanabe, Honjo (JP); Masato Ofuji, Honjo (JP); Keigo Yokoyama, Honjo (JP); Jun Kawanabe, Kodama-gun (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 111 days.

(21) Appl. No.: 13/477,472

(22) Filed: May 22, 2012

(65) Prior Publication Data

US 2012/0305785 A1    Dec. 6, 2012

(30) Foreign Application Priority Data

May 31, 2011 (JP) ................................. 2011-122015
Sep. 26, 2011 (JP) ................................. 2011-209461

(51) Int. Cl.
*G01T 1/24*        (2006.01)
*H01L 27/146*      (2006.01)

(52) U.S. Cl.
CPC .... *H01L 27/14687* (2013.01); *H01L 27/14676* (2013.01); *H01L 27/14609* (2013.01); *H01L 27/1463* (2013.01)
USPC .................................................... 250/370.08

(58) Field of Classification Search
USPC ................................................... 250/370.08
See application file for complete search history.

(56) References Cited

U.S. PATENT DOCUMENTS

| 5,930,591 A | 7/1999 | Huang |
| 2008/0203311 A1* | 8/2008 | Watanabe et al. ........ 250/370.08 |
| 2010/0320556 A1 | 12/2010 | Tredwell |

FOREIGN PATENT DOCUMENTS

| EP | 2086006 A2 | 8/2009 |
| WO | 2004/073067 A1 | 8/2004 |
| WO | 2007/001357 A2 | 1/2007 |
| WO | 2009/116177 A1 | 9/2009 |

* cited by examiner

*Primary Examiner* — David Porta
*Assistant Examiner* — Kenneth J Malkowski
(74) *Attorney, Agent, or Firm* — Canon USA, Inc. IP Division

(57) ABSTRACT

In a method of manufacturing a detection device including a plurality of pixels arrayed on a substrate, the pixels each including a switch element and a conversion element including an impurity semiconductor layer disposed on an electrode, which is disposed above the switch element, which is isolated per pixel, and which is made of a transparent conductive oxide joined to the switch element, and further including an interlayer insulating layer, which is made of an organic material, which is disposed between the switch elements and the electrodes, and which covers the switch elements, the method includes insulating members each made of an inorganic material and disposed to cover the interlayer insulating layer between adjacent two of the electrodes in contact with the interlayer insulating layer, and forming an impurity semiconductor film covering the insulating members and the electrodes and becoming the impurity semiconductor layer.

12 Claims, 20 Drawing Sheets

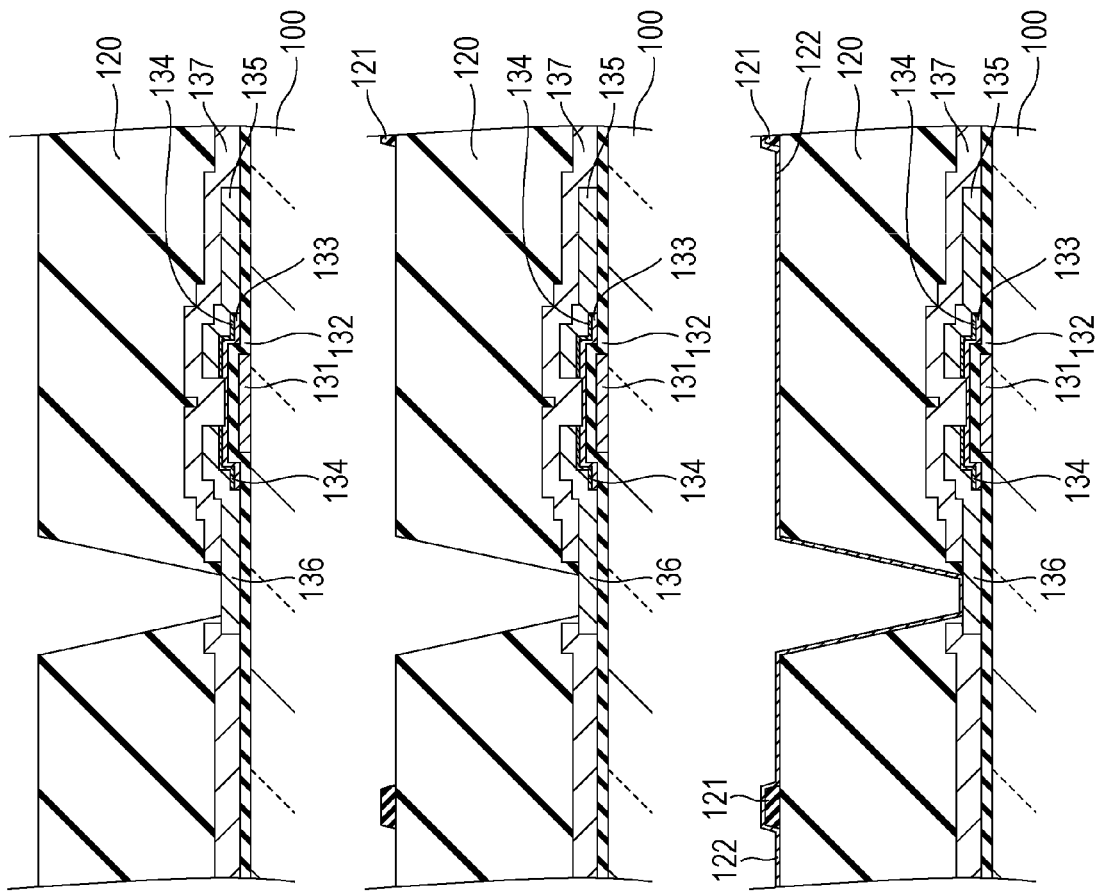

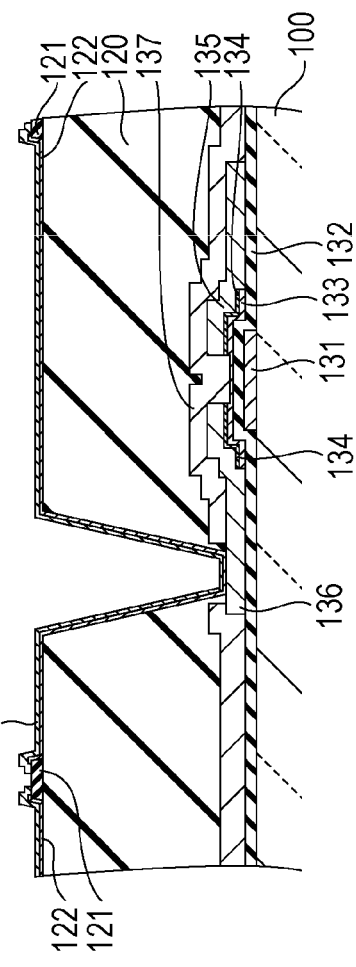
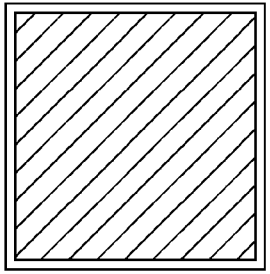
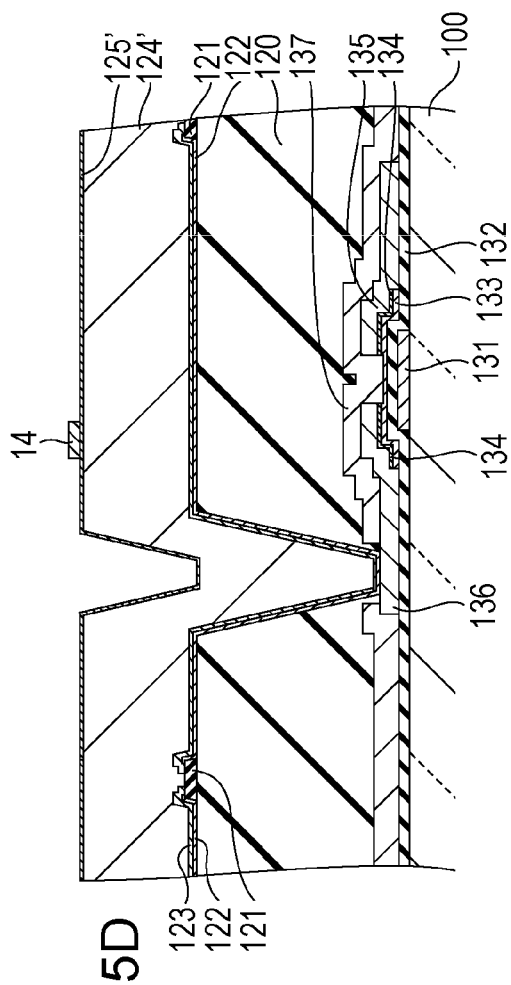
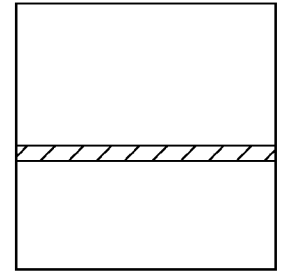

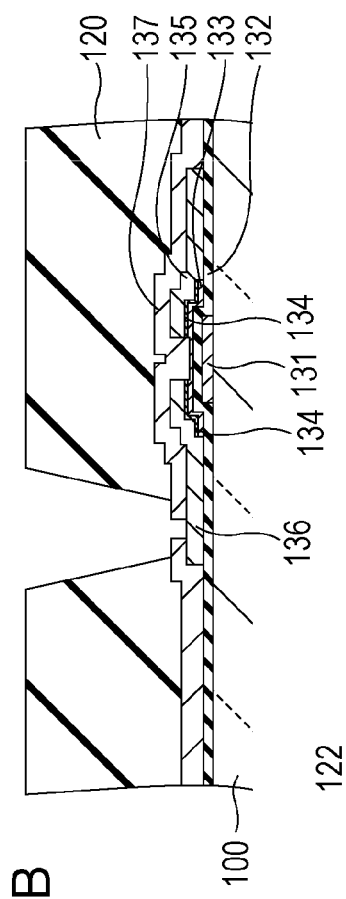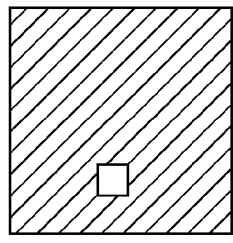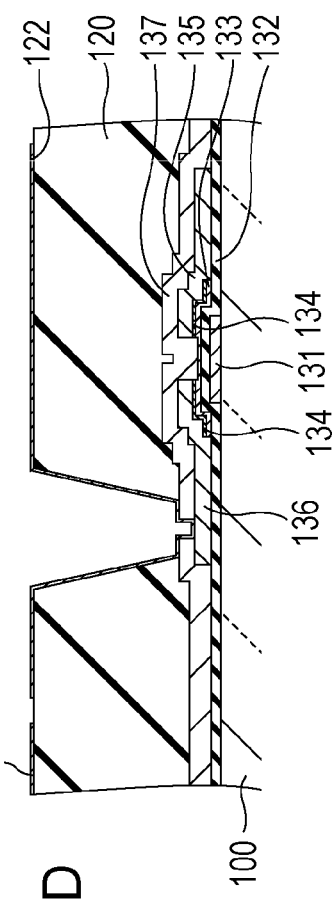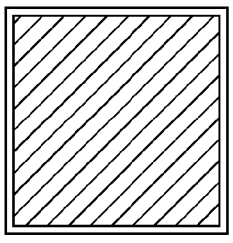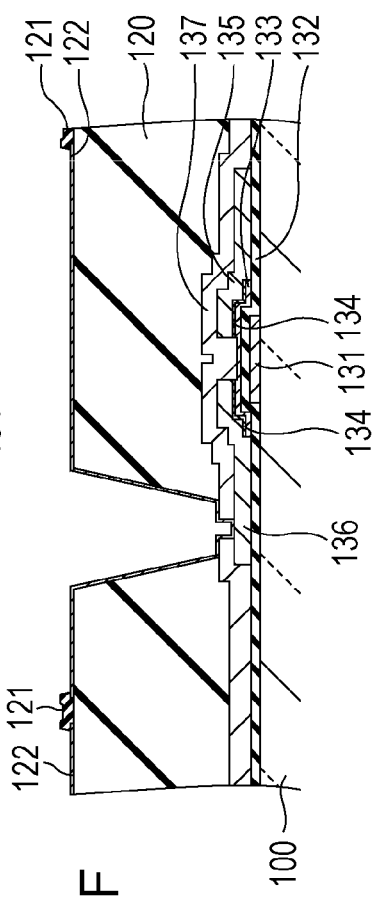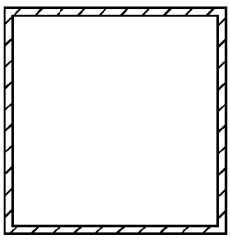

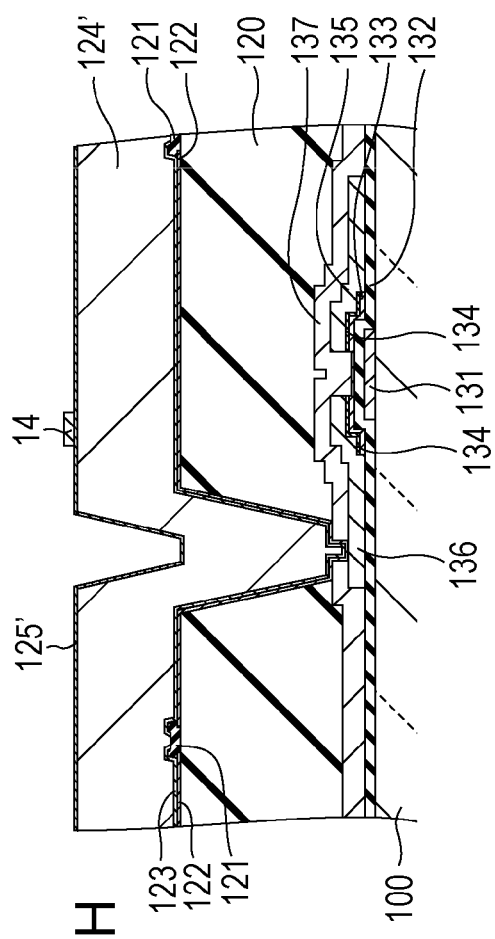
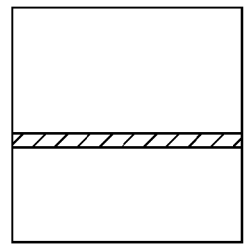
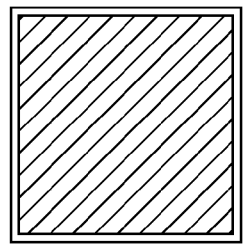
FIG. 7G
FIG. 7H
FIG. 7I
FIG. 7J

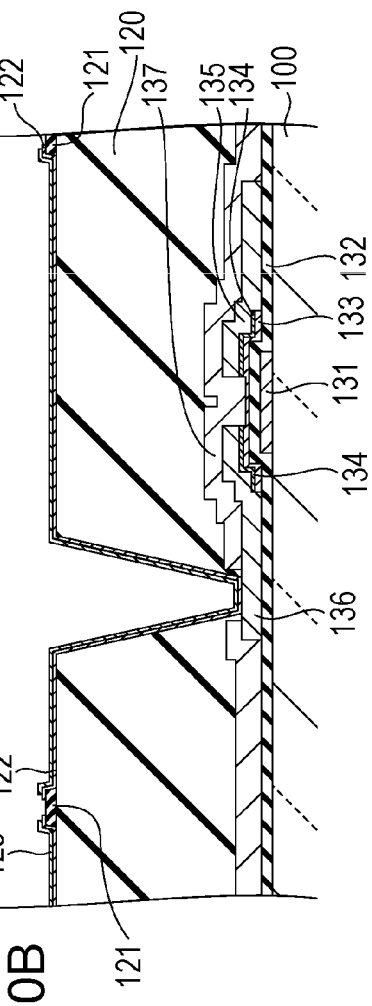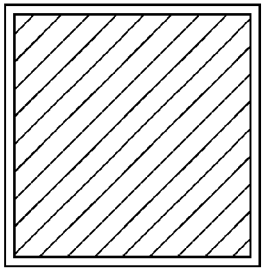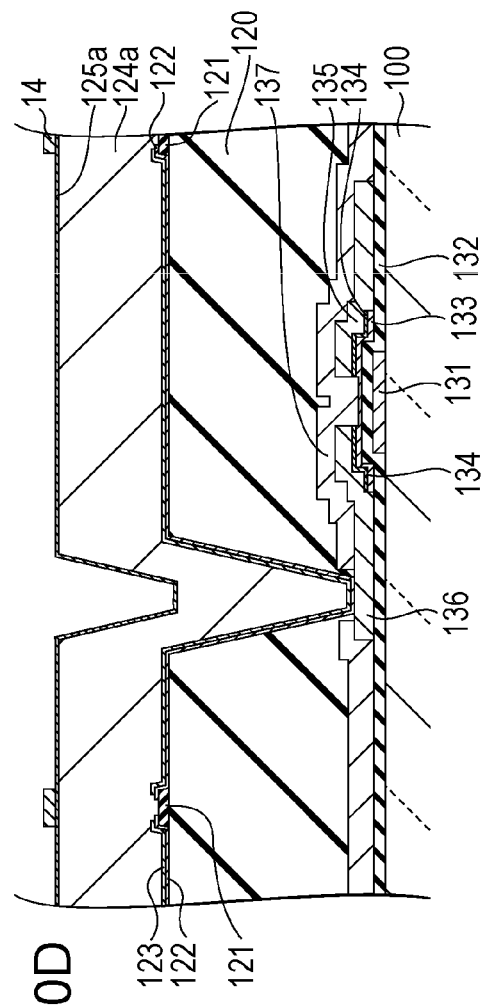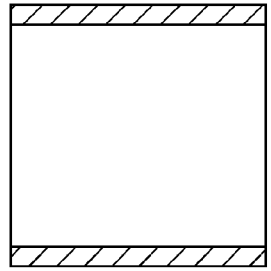

DETECTION DEVICE MANUFACTURING METHOD, DETECTION DEVICE, AND DETECTION SYSTEM

BACKGROUND OF THE INVENTION

1. Field of the Invention

One disclosed aspect of the embodiments relates to a technique of manufacturing a detection device that is applied to, e.g., a medical imaging diagnostic apparatus, a nondestructive inspection apparatus, and an analyzing apparatus using radiation. One disclosed aspect of the embodiments further relates to the detection device and a detection system.

2. Description of the Related Art

Recently, the thin-film semiconductor manufacturing technique has been utilized in the field of detection devices of the type including a pixel array in which switch elements, e.g., TFTs (thin film transistors), and conversion elements, e.g., photodiodes, for converting radiation or light to electric charges are combined with each other.

A related-art detection device disclosed in International Publication WO2007/01357 includes conversion elements disposed on electrodes, which are arrayed on a substrate, are isolated for each of pixels, and are made of a transparent conductive oxide. The related-art detection device further includes switch elements connected to the electrodes through contact holes formed in an interlayer insulating layer, which is disposed between the substrate and the electrodes and which is made of an organic material. Impurity semiconductor layers and semiconductor layers of the conversion elements are partly removed on the interlayer insulating layer such that the conversion elements are isolated per pixel.

In trying to manufacture the detection device disclosed in International Publication WO2007/01357, however, a manufacturing method includes an operation where the interlayer insulating layer is brought into an exposed state when an impurity semiconductor film becoming an impurity semiconductor layer of the conversion element later is formed. In some cases, therefore, the surface of the interlayer insulating layer is exposed when the impurity semiconductor film is formed. Accordingly, an organic material of the interlayer insulating layer may be partly scattered and mixed into the impurity semiconductor layer depending on the type of film forming process. This raises the problem that the impurity semiconductor layer of the conversion element is organically contaminated, and that defects in the impurity semiconductor layer and defects at the interface between the impurity semiconductor layer and the semiconductor layer are increased, whereby a dark current in the conversion element is increased.

To prevent the interlayer insulating layer from being exposed, an insulating layer made of an inorganic material may be disposed over the interlayer insulating layer. In such a case, however, the electrode of the conversion element, the electrode being made of the transparent conductive oxide, is disposed on the insulating layer. The transparent conductive oxide is formed through polycrystallization after forming it in an amorphous state. Internal stress in the transparent conductive oxide is changed during the polycrystallization. Because the insulating layer made of the inorganic material is harder than the interlayer insulating layer made of the organic material and has higher binding energy, a problem may occur in that the insulating layer cannot follow the change of the internal stress during the polycrystallization of the transparent conductive oxide and the electrode of the conversion element is peeled off from the insulating layer.

SUMMARY OF THE INVENTION

With the view of solving the problems described above, an embodiment provides a detection device that may reduce mixing of an organic material into an impurity semiconductor layer of a conversion element, and that may suppress peeling-off of an electrode of the conversion element.

According to one embodiment, there is provided a method of manufacturing a detection device including a plurality of pixels arrayed on a substrate, the pixels each including a switch element disposed on the substrate and a conversion element including an impurity semiconductor layer disposed on an electrode, which is disposed above the switch element, which is isolated per pixel, and which is made of a transparent conductive oxide joined to the switch element, and further including an interlayer insulating layer, which is made of an organic material, which is disposed between the plurality of switch elements and the plurality of electrodes, and which covers the switch elements, the method including an operation of forming the electrodes in contact with the interlayer insulating layer, and insulating members each made of an inorganic material and disposed to cover the interlayer insulating layer between adjacent two of the electrodes, and an operation of forming an impurity semiconductor film that covers the insulating members and the electrodes, and that becomes the impurity semiconductor layer.

According to another embodiment, there is provided a detection device including a plurality of pixels arrayed on a substrate, the pixels each including a switch element disposed on the substrate and a conversion element including an impurity semiconductor layer disposed on an electrode, which is disposed above the switch element, which is isolated per pixel, and which is made of a transparent conductive oxide joined to the switch element, an interlayer insulating layer made of an organic material, disposed between the substrate and the plurality of electrodes, and covering the switch elements, and insulating members each made of an inorganic material, disposed on the interlayer insulating layer to cover the interlayer insulating layer between adjacent two of the electrodes that are disposed on the interlayer insulating layer in contact with the interlayer insulating layer, the impurity semiconductor layer being obtained by separating, above the insulating members, the impurity semiconductor film that has been formed over the insulating members and the electrodes.

With the embodiment of the disclosure, the detection device capable of reducing mixing of the organic material into the impurity semiconductor layer of the conversion element and suppressing peeling-off of the electrode of the conversion element may be obtained.

Further features of the disclosure will become apparent from the following description of exemplary embodiments with reference to the attached drawings.

BRIEF DESCRIPTION OF THE DRAWINGS

FIGS. 2A, 2C, 2E, 2G and 2I illustrate mask patterns to explain a method of manufacturing the detection device according to the first embodiment.

FIGS. 2B, 2D, 2F, 2H and 2J are sectional views to explain the method of manufacturing the detection device according to the first embodiment.

FIGS. 5A, 5C, 5E and 5G illustrate mask patterns to explain a method of manufacturing the detection device according to the second embodiment.

FIGS. 5B, 5D, and 5F are sectional views to explain the method of manufacturing the detection device according to the second embodiment.

FIGS. 7A, 7C, 7E, 7G and 7I illustrate mask patterns to explain a method of manufacturing the detection device according to the third embodiment.

FIGS. 7B, 7D, 7F, 7H and 7J are sectional views to explain the method of manufacturing the detection device according to the third embodiment.

FIGS. 10A and 10C illustrate mask patterns to explain a method of manufacturing the detection device according to the fifth embodiment.

FIGS. 10B and 10D are sectional views to explain the method of manufacturing the detection device according to the fifth embodiment.

DESCRIPTION OF THE EMBODIMENTS

Embodiments of the disclosure will be described in detail below with reference to the attached drawings. It is to be noted that the term "radiation" used in this specification includes not only an α-ray, a β-ray and a γ-ray which are beams formed by particles (including photons) emitted with radioactive decay, but also beams having comparable or more energy, such as an X-ray, a particle ray, and a cosmic ray.

First Embodiment

Figure 1A:
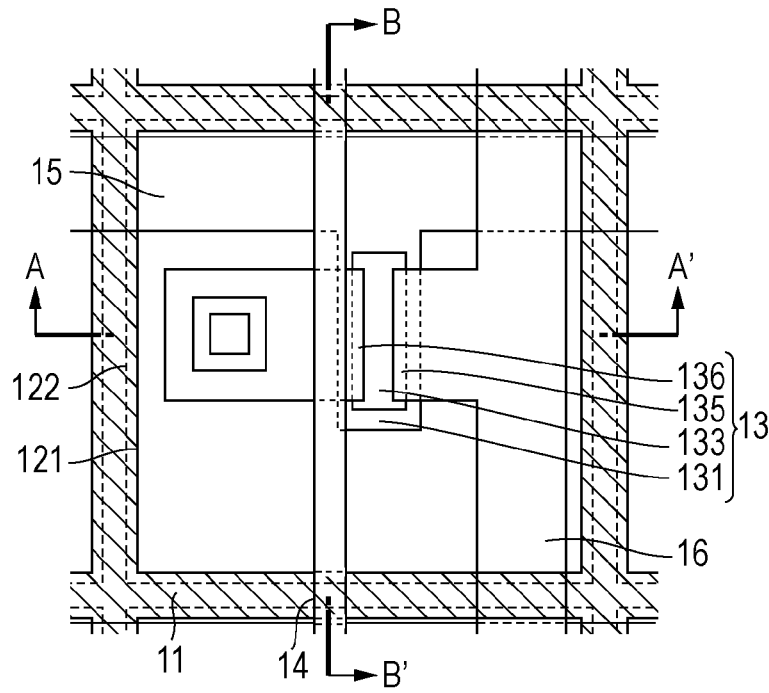
FIG. 1A is a plan view, per pixel, of a detection device according to a first embodiment.
Figure 1B:
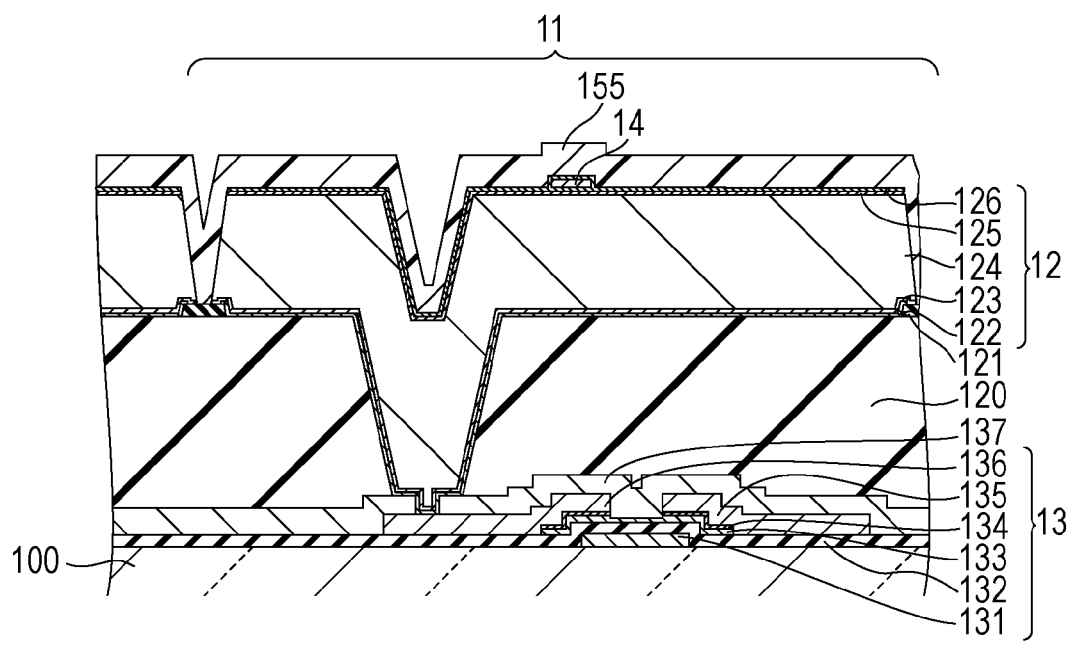
FIG. 1B is a sectional view taken along a line A-A' in FIG. 1A.
Figure 1C:
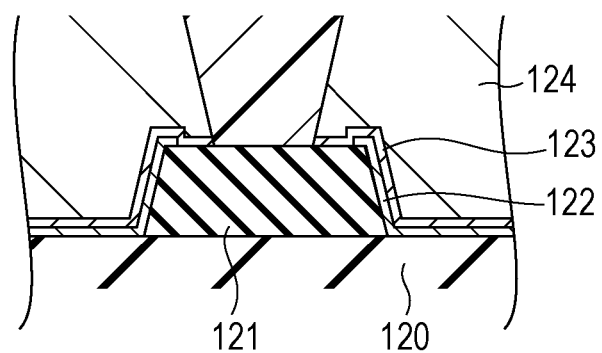
FIG. 1C is an enlarged view of a portion between pixels in FIG. 1A.
Figure 1D:
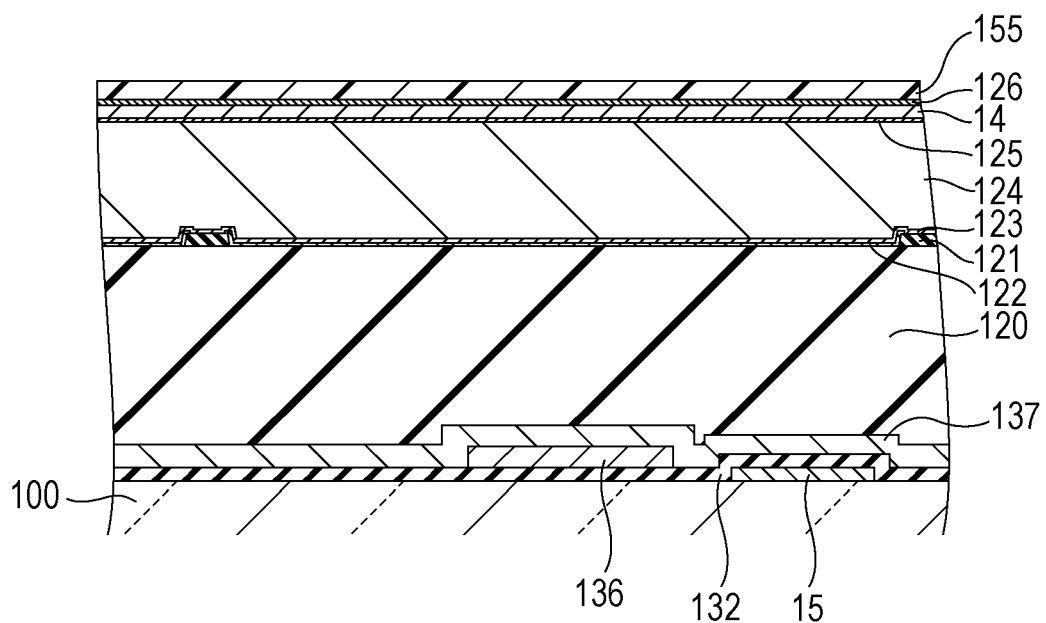
FIG. 1D is a sectional view taken along a line B-B' in FIG. 1A.

The structure of one pixel in a detection device according to a first embodiment is first described with reference to FIGS. 1A to 1D. FIG. 1A is a plan view per pixel. For the sake of simplicity, regarding a conversion element, only a first electrode is illustrated in FIG. 1A. FIG. 1B is a sectional view taken along a line A-A' in FIG. 1A, FIG. 1C is an enlarged view of a pixel end portion (i.e., a portion between pixels), and FIG. 1D is a sectional view taken along a line B-B' in FIG. 1A.

One pixel 11 in the detection device according to the first embodiment includes a conversion element 12 for converting radiation or light to electric charges, and a TFT (thin film transistor) 13 that is a switch element for outputting an electric signal corresponding to the electric charges generated in the conversion element 12. The conversion element 12 is formed of a PIN-type photodiode. The conversion element 12 is stacked on the TFT 13, which is formed on an insulating substrate 100, e.g., a glass substrate, with an interlayer insulating layer 120 interposed between the conversion element 12 and the TFT 13.

The TFT 13 includes a control electrode 131, an insulating layer 132, a semiconductor layer 133, an impurity semiconductor layer 134 having a higher impurity concentration than the semiconductor layer 133, a first main electrode 135, and a second main electrode 136, which are formed on the substrate 100 in that order from the substrate side. Partial regions of the impurity semiconductor layer 134 are contacted respectively with the first main electrode 135 and the second main electrode 136, and a region between regions of the semiconductor layer 133, which are contacted with the partial regions of the impurity semiconductor layer 134, serves as a channel region of the TFT. The control electrode 131 is electrically connected to a control wiring 15. The first main electrode 135 is electrically connected to a signal wiring 16, and the second main electrode 136 is electrically connected to a first electrode 122 of the conversion element 12. In this embodiment, the first main electrode 135, the second main electrode 136, and the signal wiring 16 are integrally formed in the same conductive layer, and the first main electrode 135 functions as a part of the signal wiring 16. A protection layer 137 is disposed to cover the TFT 13, the control wiring 15, and the signal wiring 16. While, in this embodiment, an inverted-staggered TFT using the semiconductor layer 133 and the impurity semiconductor layer 134, which are each made of primarily amorphous silicon, is employed as the switch element, the disclosure is not limited to such an example. As other examples, a staggered TFT made of primarily polycrystalline silicon, an organic TFT, an oxide TFT, etc. may also be used.

The interlayer insulating layer 120 is disposed between the substrate 100 and the plurality of first electrodes 122, described in detail below, to cover the plurality of TFTs 113, and it has a contact hole. The first electrode 122 of the conversion element 12 and the second main electrode 136 of the TFT 13 are electrically connected to each other in the contact hole formed in the interlayer insulating layer 120.

The conversion element 12 includes the first electrode 122, an impurity semiconductor layer 123 of first conductivity type, a semiconductor layer 124, an impurity semiconductor layer 125 of second conductivity type, and a second electrode 126, which are formed on the interlayer insulating layer 120 in that order from the interlayer insulating layer side. Here, the impurity semiconductor layer 123 of first conductivity type exhibits polarity of first conductivity type and has a concentration of first conductivity type impurities higher than concentrations of the first conductivity type impurities in the semiconductor layer 124 and the impurity semiconductor layer 125 of second conductivity type. Also, the impurity semiconductor layer 125 of second conductivity type exhibits polarity of second conductivity type and has a concentration of second conductivity type impurities higher than concentrations of the second conductivity type impurities in the impurity semiconductor layer 123 of first conductivity type and the semiconductor layer 124. The first conductivity type and the second conductivity type imply conductivity types having different polarities from each other. For example, when the first conductivity type is n-type, the second conductivity type is p-type. An electrode wiring 14 is electrically connected to the second electrode 126 of the conversion element 12. The first electrode 122 of the conversion element 12 is electrically connected to the second main electrode 136 of the TFT 13 in the contact hole formed in the interlayer insulating layer 120. While this embodiment employs the photodiode using the impurity semiconductor layer 123 of first conductivity type, the semiconductor layer 124, and the impurity semiconductor layer 125 of second conductivity type, which are each made of primarily amorphous silicon, the disclosure is not limited to such an example. As another example, an element capable of directly converting radiation to electric charges may also be used in which the impurity semiconductor layer 123 of first conductivity type, the semiconductor layer 124, and the impurity semiconductor layer 125 of second conductivity type are each made of primarily amorphous selenium.

An insulating member 121 made of an inorganic material is disposed in contact with the interlayer insulating layer 120 between adjacent two of the plural first electrodes 122 on the interlayer insulating layer 120. In other words, the first electrodes 122 and the insulating members 121 are disposed on the interlayer insulating layer 120 to cover the interlayer insulating layer 120. Therefore, when an impurity semiconductor film becoming the impurity semiconductor layer 123 is formed, the surface of the interlayer insulating layer 120 is not exposed, whereby mixing of the organic material into the impurity semiconductor layer 123 may be reduced. Moreover, in this embodiment, the impurity semiconductor layer 123, the semiconductor layer 124, and the impurity semiconductor layer 125 are each separated per pixel above the insulating member 121. In a dry etching operation for separating each of those layers, the insulating member 121 acts as an etching stopper layer. Accordingly, the interlayer insulating layer 120 is not exposed to the species of the dry etching, and the surrounding layers may be prevented from being contaminated by the organic material.

The first electrode 122 is made of a transparent conductive oxide, e.g., ITO. The transparent conductive oxide has such a feature that, in an amorphous state, it exhibits a much higher etching rate and higher pattern controllability than in a polycrystalline state. For that reason, the transparent conductive oxide is generally formed by a method of first etching a transparent conductive oxide formed in an amorphous state, and then polycrystallizing it in an annealing operation. Because internal stress in the transparent conductive oxide is changed in the annealing operation, the type of an underlying film in contact with the transparent conductive oxide is very important from the viewpoint of film adhesion. For example, when the transparent conductive oxide is disposed on an insulating layer made of an inorganic material having high surface hardness and high binding energy, the first electrode 122 may be peeled off because the insulating layer made of the inorganic material cannot follow deformation caused by the change of the internal stress in the ITO. On the other hand, when the transparent conductive oxide is disposed on the interlayer insulating layer 120 made of an organic material having low surface hardness and low binding energy, the interlayer insulating layer 120 may follow deformation caused by the change of the internal stress in the transparent conductive oxide in a more adaptable way than the insulating layer made of the inorganic material. Also, with energy generated during the polycrystallization of the transparent conductive oxide, the binding of the organic material is caused to rejoin with the polycrystallized transparent conductive oxide, thus making the interlayer insulating layer 120 more adaptable for the stress change. As a result, the peeling-off of the first electrode 122 may be reduced. In this embodiment, since the first electrode 122 is disposed in a width of 70 to 180 μm and is contacted in its most part with the interlayer insulating layer 120, the peeling-off of the first electrode 122 may be reduced. In this embodiment, the first electrode 122 is disposed at its end of about 5 μm on the insulating member 121, and an adhesion force between the first electrode 122 and the insulating member 121 is low. However, since such an end width is much smaller than the width where the first electrode 122 is contacted with the interlayer insulating layer 120, the problem of the peeling-off of the first electrode 122 does not occur.

A passivation layer 155 is disposed to cover the conversion elements 12.

A method of manufacturing the detection device according to the first embodiment will be described below with reference to FIGS. 2A to 2J. In particular, operations subsequent to forming the contact hole in the interlayer insulating layer 120 are described in detail with reference to mask patterns and sectional views during a process. FIGS. 2A, 2C, 2E, 2G and 2I are schematic plan views of mask patterns of photomasks used in successive operations. FIGS. 2B, 2D, 2F, 2H and 2J are schematic sectional views, taken at a position corresponding to the line A-A' in FIG. 1A, in the successive operations.

In an initial state, the plurality of TFTs 13 are disposed on the insulating substrate 100, and the protection layer 137 is disposed over the plurality of TFTs 13. The contact hole is formed by etching in a portion of the protection layer 137 above the second main electrode 136 for electrical connection to the photodiode. In an operation illustrated in FIG. 2B, an acryl resin as an organic material having photosensitivity is formed as an interlayer insulating film to cover the TFTs 13 and the protection layer 137 by using a coating apparatus, e.g., a spinner. A polyimide resin, for example, may also be used as the organic material having photosensitivity. By using a mask illustrated in FIG. 2A, the interlayer insulating layer 120 having the contact hole is then formed through exposure and development.

Next, in an operation illustrated in FIG. 2D, an insulating film made of a general inorganic material, e.g., a silicon nitride film or a silicon oxide film, is formed by plasma CVD to cover the interlayer insulating layer 120. The insulating member 121 is then formed between the pixels by etching the insulating film with the use of a mask illustrated in FIG. 2C.

Next, in an operation illustrated in FIG. 2F, an amorphous transparent conductive oxide film made of ITO is formed by sputtering to cover the interlayer insulating layer 120 and the insulating members 121. The transparent conductive oxide film is subjected to wet etching by using a mask illustrated in FIG. 2E and then to annealing for polycrystallization, thereby forming the first electrode 122 of the conversion element. At that time, the surface of the interlayer insulating layer 120 is covered with the plurality of insulating members 121 and the plurality of first electrodes 122. With the polycrystallization, internal stress in the first electrode 122 is increased. However, because a most part of the first electrode 122 is formed in contact with the interlayer insulating layer 120, adhesion therebetween is held and the problem of peeling-off of the first electrode 122 is not caused. While ITO is used as the transparent conductive oxide in this embodiment, ZnO, $SnO_2$, ATO, AZO, $CdIn_2O_4$, $MgIn_2O_4$, $ZnGa_2O_4$, and $InGaZnO_4$ may also be beneficially used. Other transparent conductive oxides containing Cu and being able to take a delafossite-type amorphous state, e.g., $CuAlO_2$, are further beneficially usable.

Figure 2H:
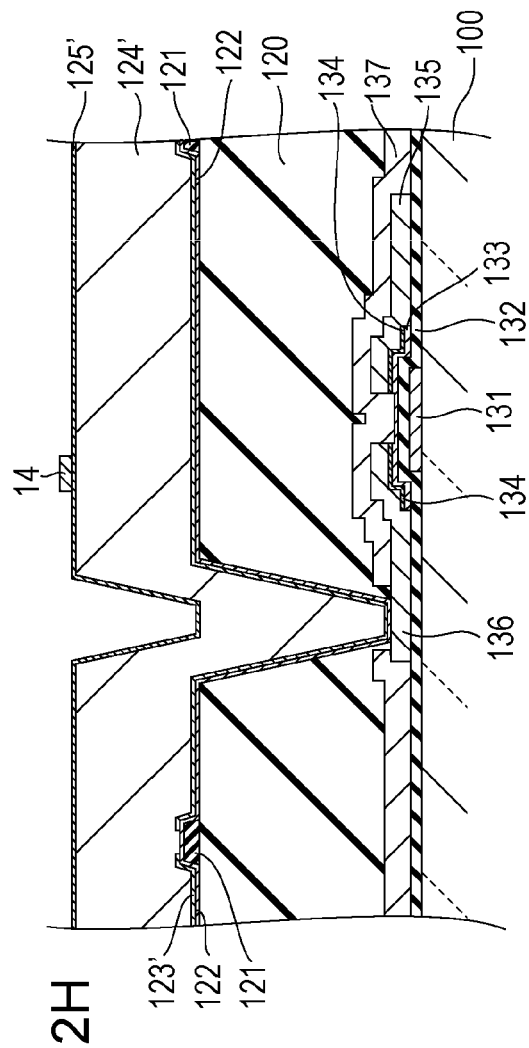
Figure 2G:
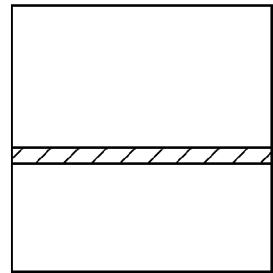

Next, in an operation illustrated in FIG. 2H, an amorphous silicon film mixed with, as an impurity, a pentavalent element, e.g., phosphorus, is formed as an impurity semiconductor film 123' of first conductivity type by plasma CVD to cover the insulating members 121 and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. When the impurity semiconductor film 123' is formed, the interlayer insulating layer 120 is exposed to plasma if the interlayer insulating layer 120 is not covered with the insulating members 121 and the first electrodes 122. If the interlayer insulating layer 120 made of the organic material is exposed to plasma, the organic material may be scattered and mixed into the impurity semiconductor film 123'. To cope with such a problem, in this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. That structure may prevent scattering of the organic material and mixing of the organic material into the impurity semiconductor film of first conductivity type. An electroconductive film made of Al, for example, which becomes the electrode wiring 14, is then formed by sputtering to cover the impurity semiconductor film 125'. Further, the electroconductive film is subjected to wet etching by using a mask illustrated in FIG. 2G, thereby forming the electrode wiring 14.

Figure 2J:
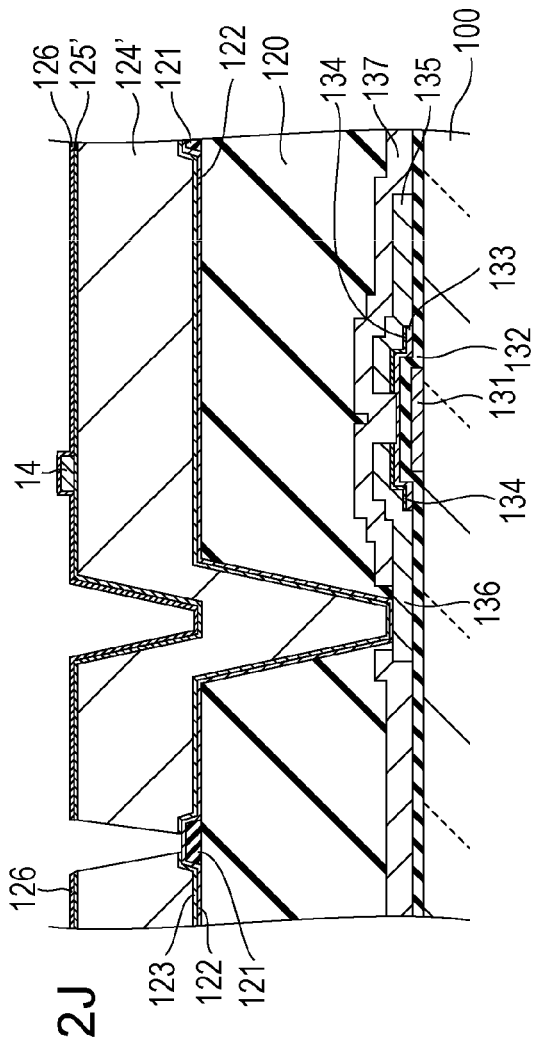
Figure 2I:
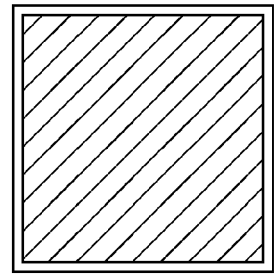

Next, in an operation illustrated in FIG. 2J, a transparent conductive oxide film is formed by sputtering to cover the impurity semiconductor film 125' and the electrode wiring 14. The transparent conductive oxide film is then subjected to wet etching by using a mask illustrated in FIG. 2I, thereby forming the second electrode 126 of the conversion element 12. Further, the conversion element 12 is isolated per pixel by partly removing the impurity semiconductor film 125', the semiconductor film 124', and the impurity semiconductor film 123' with dry etching using the same mask as that illustrated in FIG. 2I. The isolated conversion element 12 includes the impurity semiconductor layer 125, the semiconductor layer 124, and the impurity semiconductor layer 123 therein.

The pixel isolation by the dry etching is performed above each of the insulating members 121. Therefore, the insulating member 121 functions as an etching stopper layer, and the interlayer insulating layer 120 is not exposed to the species of the dry etching. Thus, contamination of the surrounding layers by the organic material may be prevented. Further, the first electrode 122 is covered with the impurity semiconductor layer 123. Accordingly, the obtained structure does not include the so-called Schottky junction, i.e., direct junction between the first electrode 122 and the semiconductor layer 124. While, in this embodiment, the transparent conductive oxide is used as the material of the second electrode 126, the disclosure is not limited to such an example as long as an electroconductive film is used. As another example, when an element directly converting radiation to electric charges is used as the conversion element 12, an electroconductive film made of, e.g., Al, through which radiation is able to easily pass, may be used as the second electrode 126.

Then, the passivation layer 155 is formed to cover the conversion elements 12 and the insulating members 121, whereby the structure illustrated in FIG. 1B is obtained. When the passivation layer 155 is formed, the interlayer insulating layer 120 is not exposed and contamination of the surrounding layers by the organic material may be prevented.

In this embodiment, when the conversion element 12 is isolated per pixel by the dry etching in the operation illustrated in FIG. 2J, the electrode wiring 14 acts as an etching mask. Therefore, as illustrated in FIG. 1D, the impurity semiconductor film 125', the semiconductor film 124', and the impurity semiconductor film 123' remain in an area where an orthographically-projected image of the electrode wiring 14 is positioned, without being removed. This provides a structure that the impurity semiconductor layer 123 in the area where the orthographically-projected image of the electrode wiring 14 is positioned is continued between the first electrodes 122 of the pixels adjacent to each other. Even with such a structure, when resistance of the impurity semiconductor layer 123 is so sufficiently high that the impurity semiconductor layer 123 may be regarded as an insulator, the impurity semiconductor layer 123 is substantially electrically isolated per pixel and the detection device may operate without problems. In order to obtain the impurity semiconductor layer 123 having sufficiently high resistance, a layer thickness and a dope amount are to be properly controlled.

Figure 3:
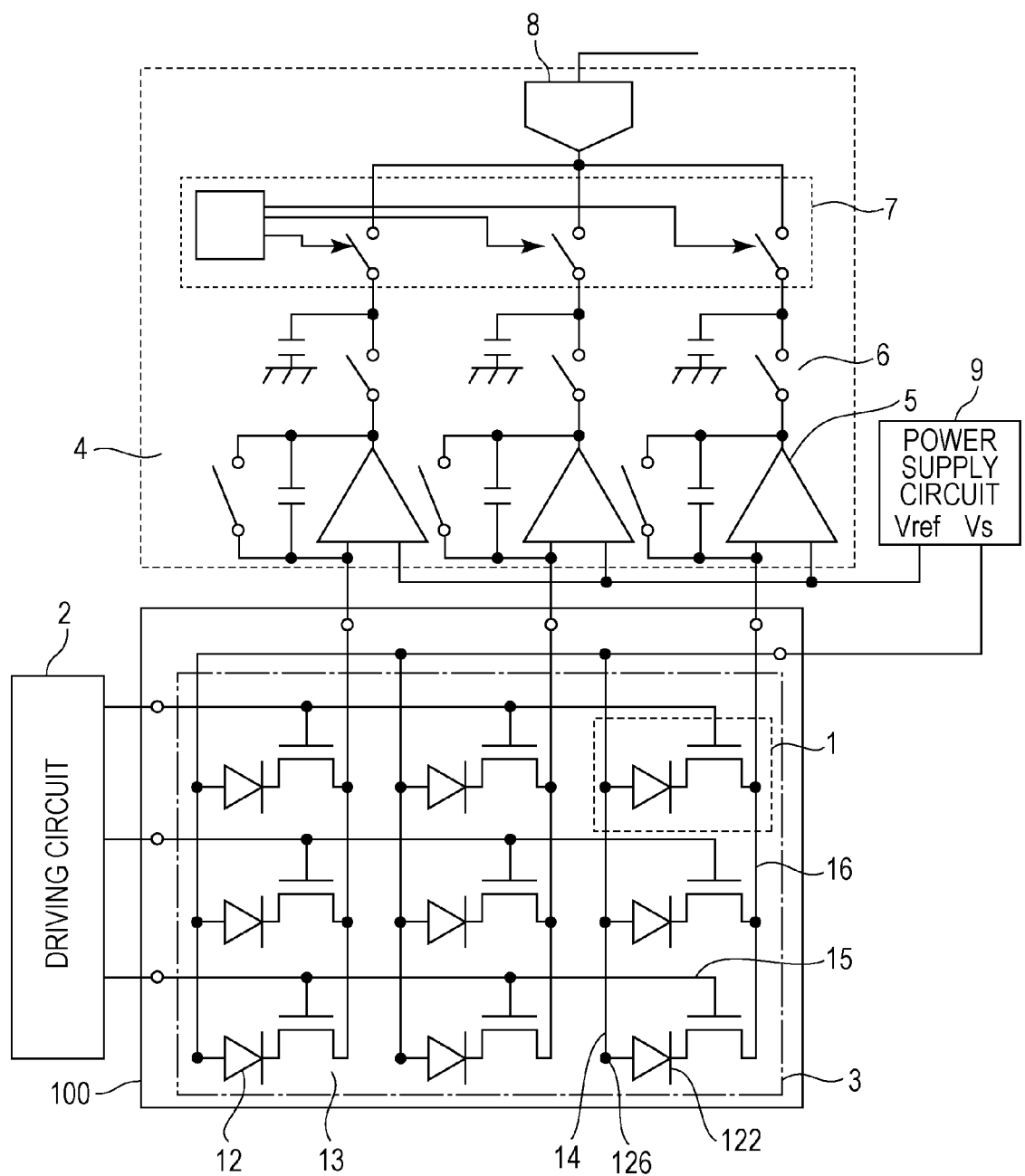
FIG. 3 is an equivalent circuit diagram of the detection device according to the first embodiment.

A schematic equivalent circuit of the detection device according to the first embodiment will be described below with reference to FIG. 3. While FIG. 3 is an equivalent circuit diagram of 3 rows and 3 columns for the sake of simplifying the explanation, the disclosure is not limited to such an example, and the detection device has a pixel array of n rows and m columns (n, m: natural number equal to or more than 2). In the detection device according to this embodiment, a conversion section 3 including a plurality of pixels 1 arrayed in the row direction and the column direction is disposed on the surface of the substrate 100. Each pixel 1 includes the conversion element 12 for converting radiation or light to electric charges, and the TFT 13 for outputting an electric signal corresponding to the electric charges generated in the conversion element 12. A scintillator (not illustrated) for converting radiation to visible light through wavelength conversion may be disposed on the surface of the conversion element 12 on the side including the second electrode 126. Each electrode wiring 14 is connected in common to the second electrodes 126 of the plurality of conversion elements 12 arrayed in the column direction. Each control wiring 15 is connected in common to the control electrodes 131 of the plurality of TFTs 13 arrayed in the row direction, and it is further electrically connected to a driving circuit 2. The driving circuit 2 successively or simultaneously supplies driving pulses to the plurality of control wirings 15 arrayed in the column direction, whereby the electric signals from the pixels are output in parallel in units of row to the plurality of signal wirings 16 arrayed in the row direction. Each signal wiring 16 is connected in common to the first main electrodes 135 of the plurality of TFTs 13 arrayed in the column direction, and it is further electrically connected a read circuit 4. The read circuit 4 includes, per signal wiring 16, an integrating amplifier 5 for integrating and amplifying an electric signal from the signal wiring 16, and a sample and hold circuit 6 for sampling and holding the electric signal that has been amplified by and output from the integrating amplifier 5. The read circuit 4 further includes a multiplexer 7 for converting the electric signals output in parallel from the plurality of sample and hold circuits 6 to a serial electric signal, and an A/D converter 8 for converting the output electric signal to digital data. A reference potential Vref is supplied from a power supply circuit 9 to a non-inverting input terminal of the integrating amplifier 5. Further, the power supply circuit 9 is electrically connected to the plurality of electrode wirings 14 arrayed in the row direction, thus supplying a bias potential Vs to the second electrodes 126 of the conversion elements 12.

The operation of the detection device according to this embodiment will be described below. The reference potential Vref is applied to the first electrode 122 of each conversion element 12 through the TFT 13, and the bias potential Vs for separating electron-hole pairs generated by radiation or visible light is applied to the second electrode 126. In that state, when radiation having passed through a specimen or visible light corresponding to the radiation enters the conversion element 12, it is converted to electric charges, which are accumulated in the conversion element 12. The electric signal corresponding to the accumulated electric charges is output to the signal wiring 16 when the TFT 13 is brought into a conductive state by the driving pulse that is applied to the control wiring 15 from the driving circuit 2. The electric signal is then read as digital data to the outside by the read circuit 4.

Second Embodiment

Figure 4A:
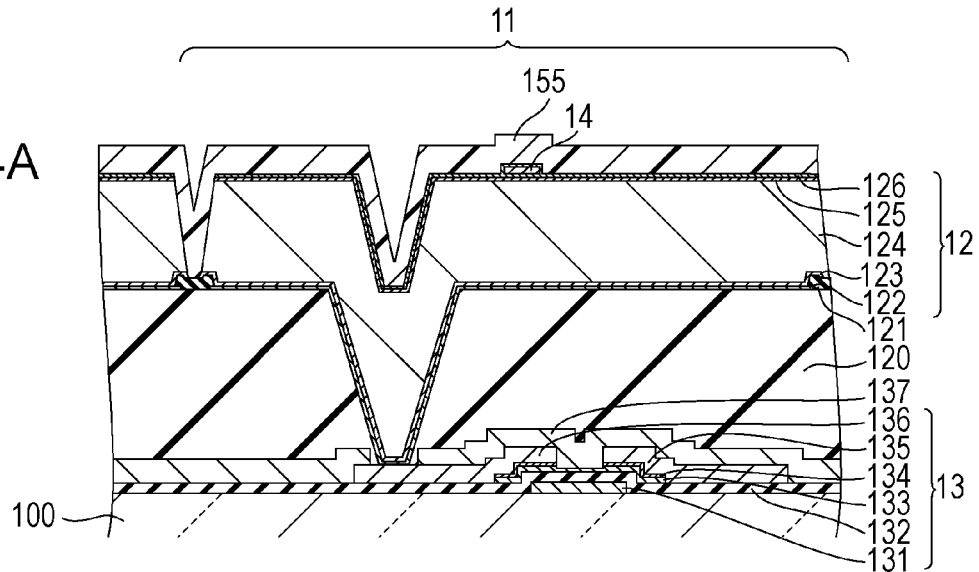
FIG. 4A is a sectional view, per pixel, of a detection device according to a second embodiment.
Figure 4B:
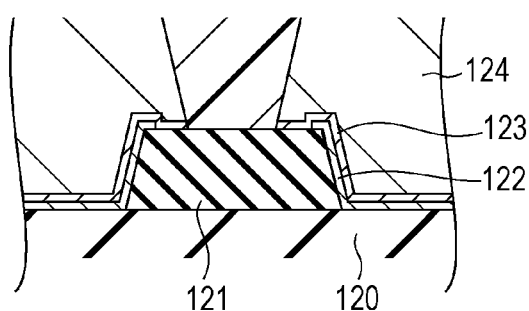
FIG. 4B is an enlarged view of a portion between pixels in FIG. 4A.
Figure 4C:
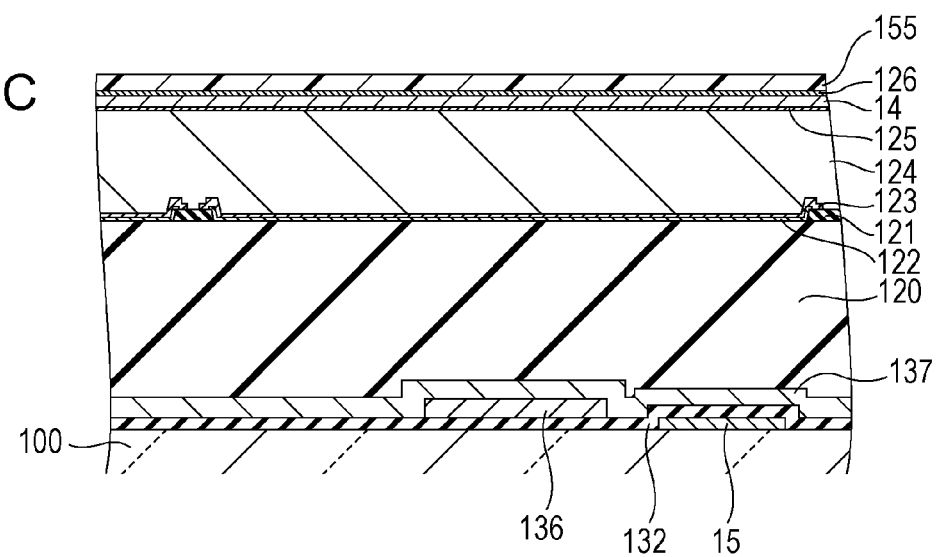
FIG. 4C is another sectional view, per pixel, of the detection device according to the second embodiment.

The structure of one pixel in a detection device according to a second embodiment will be described below with reference to FIGS. 4A to 4C. FIG. 4A is a sectional view taken along a line corresponding to the line A-A' in FIG. 1A, FIG. 4B is an enlarged view of a pixel end portion (i.e., a portion between pixels), and FIG. 4C is a sectional view taken along a line corresponding to the B-B' in FIG. 1A. The same components in the second embodiment as those described above in the first embodiment are denoted by the same reference symbols and detailed description of those components is omitted.

In the first embodiment, as illustrated in FIG. 1D, the impurity semiconductor layer 123 in the area where the orthographically-projected image of the electrode wiring 14 is positioned is continued between the first electrodes 122 of the adjacent pixels. In the second embodiment, however, the impurity semiconductor layer 123 is formed just after forming the impurity semiconductor film 123'. Therefore, as illustrated in FIG. 4C, the pixels may be obtained in a structure that the impurity semiconductor layer 123 is separated per pixel.

Figure 5E:
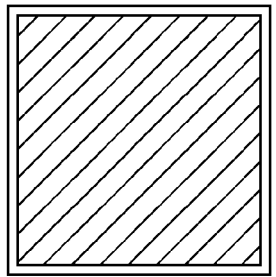
Figure 5F:
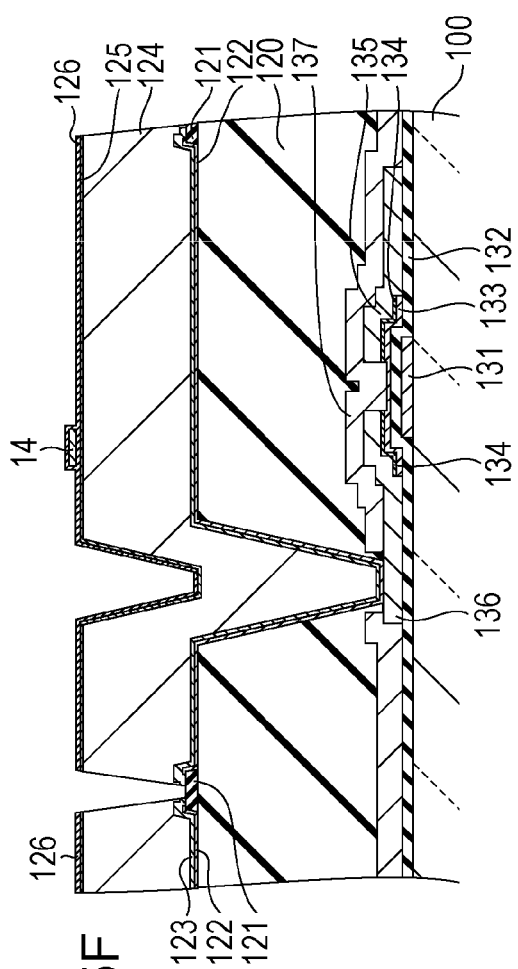

A method of manufacturing the detection device according to the second embodiment will be described below with reference to FIGS. 5A to 5G. FIGS. 5A, 5C, 5E and 5G are schematic plan views of mask patterns of photomasks used in successive operations. FIGS. 5B, 5D and 5F are schematic sectional views, taken at a position corresponding to the line A-A' in FIG. 1A, in the successive operations. Detailed description of the same operations as those described in the first embodiment is omitted. In particular, since operations until forming the first electrode 122 are the same as those described above with reference to FIGS. 2A to 2F, subsequent operations are described.

In an operation illustrated in FIG. 5B, an amorphous silicon film mixed with, as an impurity, a pentavalent element, e.g., phosphorus, is formed as the impurity semiconductor film 123' of first conductivity type by plasma CVD to cover the insulating members 121 and the first electrodes 122. When the impurity semiconductor film 123' is formed, the interlayer insulating layer 120 is exposed to plasma if the interlayer insulating layer 120 is not covered with the insulating members 121 and the first electrodes 122. If the interlayer insulating layer 120 made of the organic material is exposed to plasma, the organic material may be scattered and mixed into the impurity semiconductor film 123'. To cope with such a problem, in this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. That structure may prevent scattering of the organic material and mixing of the organic material into the impurity semiconductor film of first conductivity type. The impurity semiconductor film 123' is then subjected to dry etching using a mask illustrated in FIG. 5A, thereby forming the impurity semiconductor layer 123. The pixel isolation by the dry etching is performed above each of the insulating members 121. Therefore, the insulating member 121 functions as an etching stopper layer, and the interlayer insulating layer 120 is not exposed to the species of the dry etching. Thus, contamination of the impurity semiconductor layer 123 by the organic material may be prevented. Here, the first electrode 122 is in the form covered with the impurity semiconductor layer 123.

Next, in an operation illustrated in FIG. 5D, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD to cover the insulating members 121 and the impurity semiconductor layer 123. An electroconductive film made of Al, for example, which becomes the electrode wiring 14, is then formed by sputtering to cover the impurity semiconductor film 125'. Further, the electroconductive film is subjected to wet etching by using a mask illustrated in FIG. 5C, thereby forming the electrode wiring 14.

Next, in an operation illustrated in FIG. 5F, a transparent conductive oxide film is formed by sputtering to cover the impurity semiconductor film 125' and the electrode wiring 14. The transparent conductive oxide film is then subjected to wet etching by using a mask illustrated in FIG. 5E, thereby forming the second electrode 126 of the conversion element 12. Further, the conversion element 12 is isolated per pixel by removing the impurity semiconductor film 125' and the semiconductor film 124' with dry etching using the same mask as that illustrated in FIG. 5E. The isolated conversion element 12 includes the impurity semiconductor layer 125, the semiconductor layer 124, and the impurity semiconductor layer 123 therein. The pixel isolation by the dry etching is performed above each of the insulating members 121. Therefore, the insulating member 121 functions as an etching stopper layer, and the interlayer insulating layer 120 is not exposed to the species of the dry etching. Thus, contamination of the surrounding layers by the organic material may be prevented. Further, the first electrode 122 is covered with the impurity semiconductor layer 123. Accordingly, the obtained structure does not include the so-called Schottky junction, i.e., direct junction between the first electrode 122 and the semiconductor layer 124. While, in this embodiment, the transparent conductive oxide is used as the material of the second electrode 126, the disclosure is not limited to such an example as long as an electroconductive film is used. As another example, when an element directly converting radiation to electric charges is used as the conversion element 12, an electroconductive film made of, e.g., Al, through which radiation is able to easily pass, may be used as the second electrode 126.

Then, the passivation layer 155 is formed to cover the conversion elements 12 and the insulating members 121, whereby the structure illustrated in FIGS. 4A and 4C is obtained. When the passivation layer 155 is formed, the interlayer insulating layer 120 is not exposed and contamination of the surrounding layers by the organic material may be prevented.

Figure 5G:
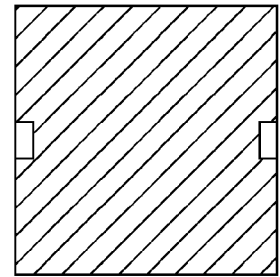

While, in this embodiment, the impurity semiconductor layer 123 is individually formed in the operation illustrated in FIG. 5B by using the mask illustrated in FIG. 5A, the impurity semiconductor film 123' may be removed by using the mask illustrated in FIG. 5G instead of the mask illustrated in FIG. 5A. In such a case, after previously removing the impurity semiconductor film 123' in portions illustrated in FIG. 5G, the impurity semiconductor film 125', the semiconductor film 124', and the impurity semiconductor film 123' are removed in the operation illustrated in FIG. 5F by dry etching with the use of the mask illustrated in FIG. 5E. As a result, the conversion element 12 may be obtained in which the impurity semiconductor layer 123 is isolated per pixel. Further, by using the mask illustrated in FIG. 5G, an area of the impurity semiconductor layer 123 is substantially determined only by the dry etching in the operation illustrated in FIG. 5F. Accordingly, the area of the impurity semiconductor film 123' may be increased in comparison with the case where the mask illustrated in FIG. 5A is used and alignment between the dry etching operation for the impurity semiconductor film 123' and the dry etching operation for the semiconductor film 124' is to be taken in consideration.

Third Embodiment

Figure 6A:
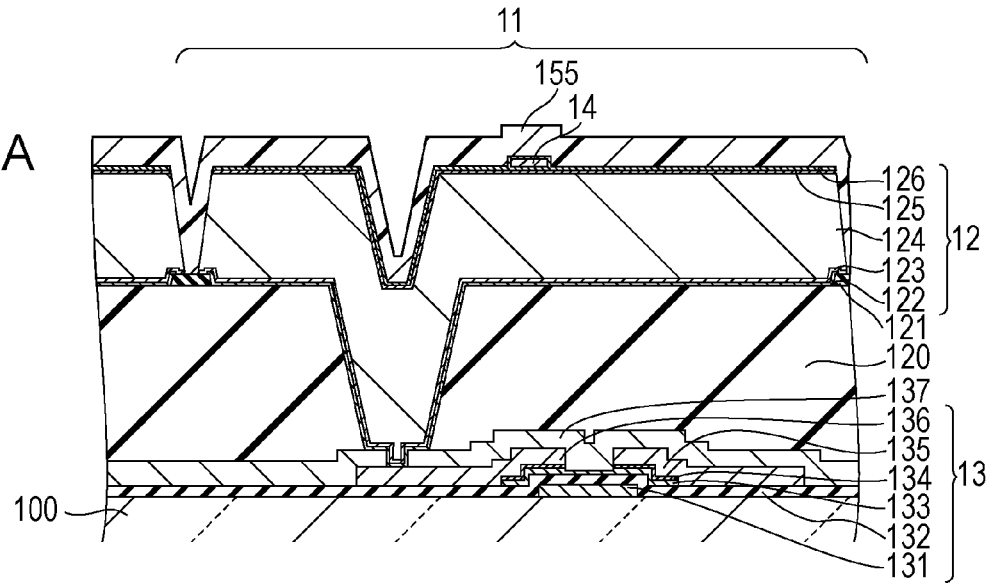
FIG. 6A is a sectional view, per pixel, of a detection device according to a third embodiment.
Figure 6B:
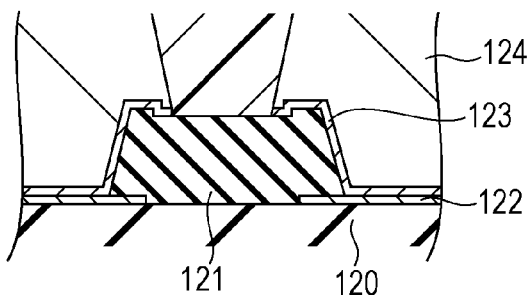
FIG. 6B is an enlarged view of a portion between pixels in FIG. 6A.
Figure 6C:
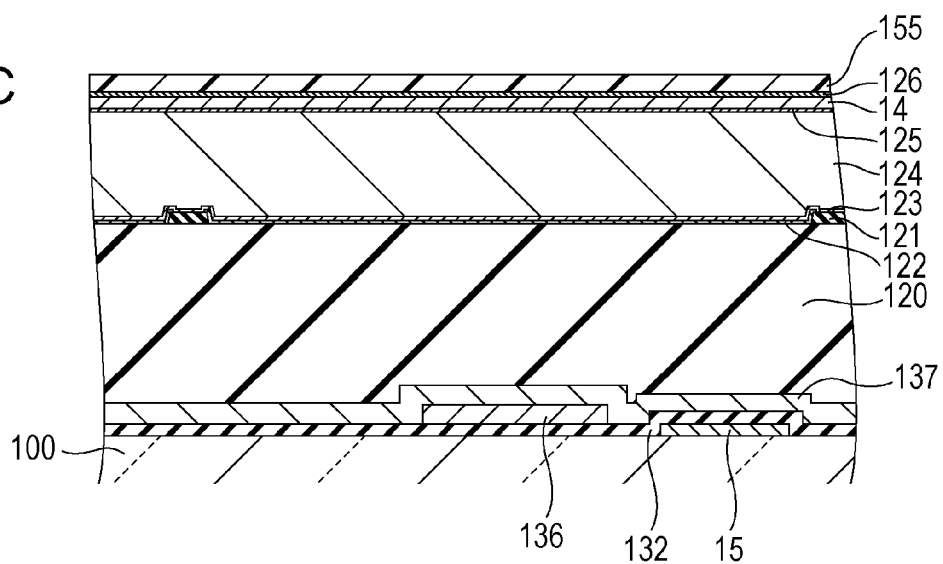
FIG. 6C is another sectional view, per pixel, of the detection device according to the third embodiment.

The structure of one pixel in a detection device according to a third embodiment will be described below with reference to FIGS. 6A to 6C. FIG. 6A is a sectional view taken along a line corresponding to the line A-A' in FIG. 1A, FIG. 6B is an enlarged view of a pixel end portion (i.e., a portion between pixels), and FIG. 6C is a sectional view taken along a line corresponding to the B-B' in FIG. 1A. The same components in the third embodiment as those described above in the foregoing embodiments are denoted by the same reference symbols and detailed description of those components is omitted.

The end of the first electrode 122 is disposed on the insulating member 121 in the first embodiment, while the end of the first electrode 122 is disposed between the interlayer insulating layer 120 and the insulating member 121 in the third embodiment. With such an arrangement, the first electrode 122 made of the transparent conductive oxide is entirely positioned only on the interlayer insulating layer 120, and adhesion between the interlayer insulating layer 120 and the first electrode 122 may be increased in comparison with that in the first embodiment.

A method of manufacturing the detection device according to the third embodiment will be described below with reference to FIGS. 7A to 7J. In particular, operations subsequent to forming the contact hole in the interlayer insulating layer are described in detail with reference to mask patterns and sectional views during a process. FIGS. 7A, 7C, 7E, 7G and 7I are schematic plan views of mask patterns of photomasks used in successive operations. FIGS. 7B, 7D, 7F, 7H and 7J are schematic sectional views, taken at a position corresponding to the line A-A' in FIG. 1A, in the successive operations. Detailed description of the same operations in the third embodiment as those described above in the foregoing embodiments is omitted.

In an operation illustrated in FIG. 7B, an acryl resin as an organic material having photosensitivity is formed as an interlayer insulating film to cover the TFTs 13 and the protection layer 137. The interlayer insulating layer 120 having the contact hole is then formed by using a mask illustrated in FIG. 7A.

Next, in an operation illustrated in FIG. 7D, an amorphous transparent conductive oxide film made of ITO is formed by sputtering to cover the interlayer insulating layer 120. The transparent conductive oxide film is subjected to wet etching by using a mask illustrated in FIG. 7C and then to annealing for polycrystallization, thereby forming the first electrode 122 of the conversion element. With the polycrystallization, internal stress in the first electrode 122 is increased. However, because the entirety of the first electrode 122 is formed in contact with the interlayer insulating layer 120, adhesion therebetween is held and the problem of peeling-off of the first electrode 122 is not caused.

Next, in an operation illustrated in FIG. 7F, an insulating film made of an inorganic material, e.g., a silicon nitride film, is formed by plasma CVD to cover the interlayer insulating layer 120 and the first electrodes 122. The insulating member 121 is then formed between adjacent two of the pixels by etching the insulating film with the use of a mask illustrated in FIG. 7E. Thus, the surface of the interlayer insulating layer 120 is covered with the insulating members 121 and the first electrodes 122.

Next, in an operation illustrated in FIG. 7H, an amorphous silicon film mixed with, as an impurity, a pentavalent element, e.g., phosphorus, is formed as an impurity semiconductor film 123' of first conductivity type by plasma CVD to cover the insulating members 121 and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. In this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. That structure may prevent scattering of the organic material and mixing of the organic material into the impurity semiconductor film of first conductivity type. An electroconductive film made of Al, for example, which becomes the electrode wiring 14, is then formed by sputtering to cover the impurity semiconductor film 125'. Further, the electroconductive film is subjected to wet etching by using a mask illustrated in FIG. 7G, thereby forming the electrode wiring 14.

Next, in an operation illustrated in FIG. 7J, a transparent conductive oxide film is formed by sputtering to cover the impurity semiconductor film 125' and the electrode wiring 14. The transparent conductive oxide film is then removed by wet etching with the use of a mask illustrated in FIG. 7I, thereby forming the second electrode 126 of the conversion element 12. Further, the conversion element 12 is isolated per pixel by partly removing the impurity semiconductor film 125', the semiconductor film 124', and the impurity semiconductor film 123' with dry etching using the same mask as that illustrated in FIG. 7I. The isolated conversion element 12 includes the impurity semiconductor layer 125, the semiconductor layer 124, and the impurity semiconductor layer 123 therein. The pixel isolation by the dry etching is performed on the insulating member 121. Therefore, the insulating member 121 functions as an etching stopper layer, and the interlayer insulating layer 120 is not exposed to the species of the dry etching. Thus, contamination of the surrounding layers by the organic material may be prevented.

Then, the passivation layer 155 is formed to cover the conversion elements 12 and the insulating members 121, whereby the structure illustrated in FIG. 6A is obtained. When the passivation layer 155 is formed, the interlayer insulating layer 120 is not exposed and contamination of the surrounding layers by the organic material may be prevented.

In the structure obtained with this embodiment, the impurity semiconductor layer 123 in the area where the orthographically-projected image of the electrode wiring 14 is positioned is continued between the first electrodes 122 of the pixels adjacent to each other. Even with such a structure, when resistance of the impurity semiconductor layer 123 is so sufficiently high that the impurity semiconductor layer 123 may be regarded as an insulator, the impurity semiconductor layer 123 is substantially electrically isolated per pixel and the detection device may operate without problems.

Fourth Embodiment

Figure 8A:
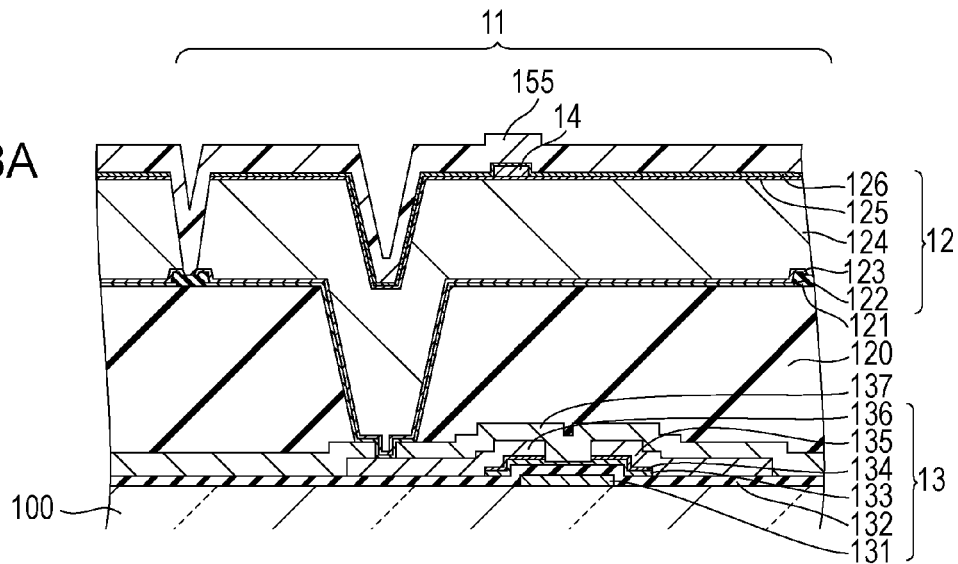
FIG. 8A is a sectional view, per pixel, of a detection device according to a fourth embodiment.
Figure 8B:
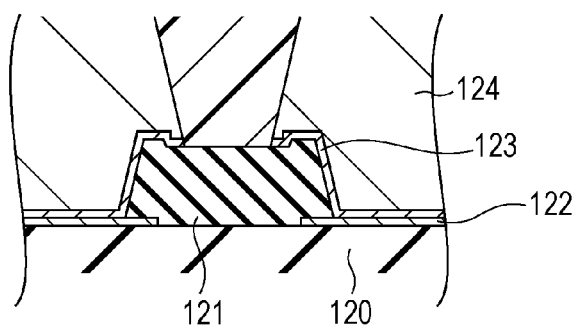
FIG. 8B is an enlarged view of a portion between pixels in FIG. 8A.
Figure 8C:
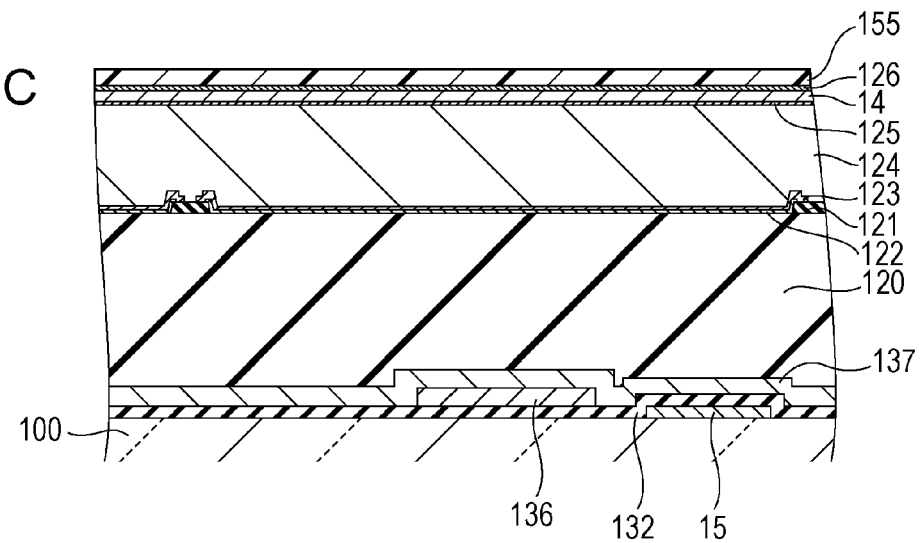
FIG. 8C is another sectional view, per pixel, of the detection device according to the fourth embodiment.

The structure of one pixel in a detection device according to a fourth embodiment will be described below with reference to FIGS. 8A to 8C. FIG. 8A is a sectional view taken along a line corresponding to the line A-A' in FIG. 1A, FIG. 8B is an enlarged view of a pixel end portion (i.e., a portion between pixels), and FIG. 8C is a sectional view taken along a line corresponding to the B-B' in FIG. 1A. The same components in the fourth embodiment as those described above in the third embodiment are denoted by the same reference symbols and detailed description of those components is omitted.

In the third embodiment, as illustrated in FIG. 6C, the impurity semiconductor layer 123 in the area where the orthographically-projected image of the electrode wiring 14 is positioned is continued between the first electrodes 122 of the pixels adjacent to each other. In the fourth embodiment, however, the impurity semiconductor layer 123 is formed just after forming the impurity semiconductor film 123' as in the second embodiment. Therefore, as illustrated in FIG. 8C, the pixel structure is obtained in which the impurity semiconductor layer 123 is separated between the pixels.

A manufacturing method in the fourth embodiment is similar to the operations of FIGS. 7B, 7D and 7F, described above in the third embodiment, until the operation of forming the insulating member 121, and operations subsequent to the operation of forming the impurity semiconductor layer 123 are similar to the operations described above in the second embodiment. Hence detailed description of the manufacturing method in the fourth embodiment is omitted.

Fifth Embodiment

Figure 9A:
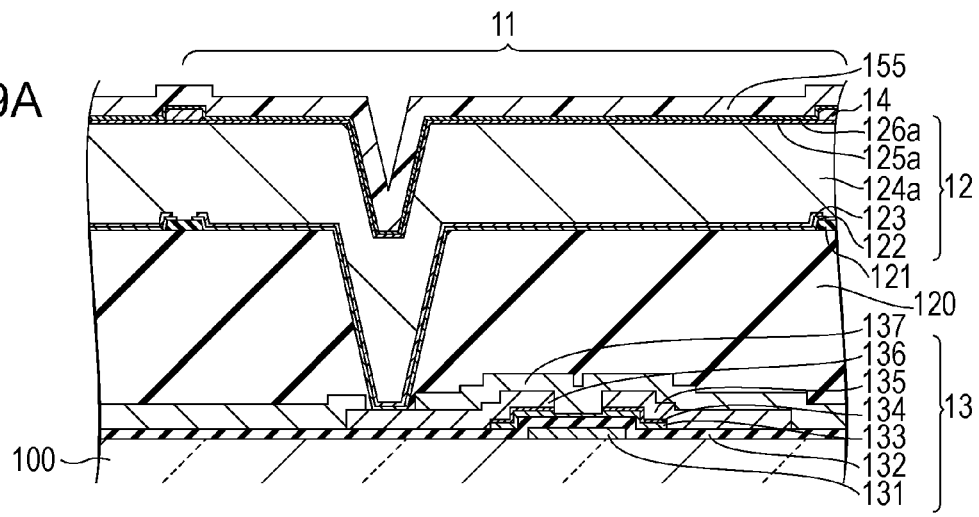
FIG. 9A is a sectional view, per pixel, of a detection device according to a fifth embodiment.
Figure 9B:
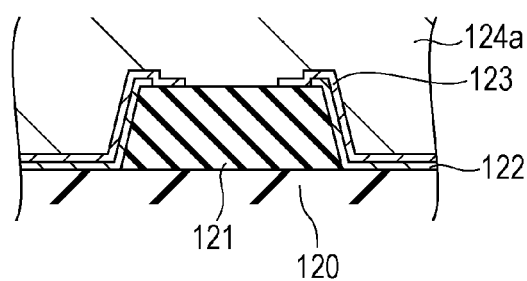
FIG. 9B is an enlarged view of a portion between pixels in FIG. 9A.
Figure 9C:
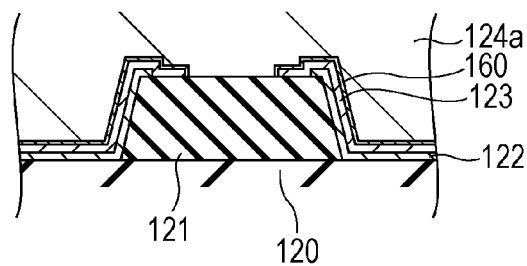
FIG. 9C is an enlarged view illustrating another example of the portion between the pixels in FIG. 9A.

The structure of one pixel in a detection device according to a fifth embodiment will be described below with reference to FIGS. 9A to 9C. FIG. 9A is a sectional view taken along a line corresponding to the line A-A' in FIG. 1A, and FIG. 9B is an enlarged view of a pixel end portion (i.e., a portion between pixels). FIG. 9C is an enlarged view illustrating another example of the pixel end portion (i.e., the portion between pixels). The same components in the fifth embodiment as those described above in the foregoing embodiments are denoted by the same reference symbols and detailed description of those components is omitted.

In the first embodiment, the semiconductor layer 124, the impurity semiconductor layer 125, and the second electrode 126 are separated per pixel. On the other hand, in the fifth embodiment, a semiconductor layer 124a, an impurity semiconductor layer 125a, and a second electrode 126a are each not separated per pixel as illustrated in FIG. 9A. Because the first electrode 122 and the impurity semiconductor layer 123 are each separated per pixel, the conversion element 12 is individualized for each first electrode 122. With the structure of the fifth embodiment, therefore, an aperture ratio may be increased in comparison with that in the first embodiment. To further ensure individualization of the first electrode 122, as illustrated in FIG. 9C, a semiconductor layer 160 having a higher hydrogen concentration than the semiconductor layer 124a may be disposed in a very thin thickness of about 5 nm to cover the insulating member 121 and the impurity semiconductor layer 123. Because the semiconductor layer 160 has a higher specific resistance than the semiconductor layer 124a and the impurity semiconductor layer 123, leak between the adjacent pixels may be reduced. Further, by setting a thickness of the semiconductor layer 160 to be sufficiently thin so as being able to develop the tunnel effect, electric charges are movable between the impurity semiconductor layer 123 and the semiconductor layer 124a, whereby the conversion element 12 may function as a photodiode. Moreover, since the second electrode 126a is not separated per pixel, the electrode wiring 14 that is a component reducing the aperture ratio may be dispensed with. However, when the resistance is too high with the presence of only the second electrode 126a, it is more beneficial to provide the electrode wiring 14 as well. In such a case, since the semiconductor layer 124a and the second electrode 126a are each not separated per pixel, the electrode wiring 14 may be disposed at a position where the orthographically-projected image of the electrode wiring 14 overlaps with the insulating member 121, and the electrode wiring 14 may be disposed without reducing the aperture ratio.

A method of manufacturing the detection device according to the fifth embodiment will be described below with reference to FIGS. 10A to 10D. FIGS. 10A and 10C are schematic plan views of mask patterns of photomasks used in successive operations. FIGS. 10B and 10D are schematic sectional views, taken at a position corresponding to the line A-A' in FIG. 1A, in the successive operations. Detailed description of the same operations as those described in the first embodiment is omitted. In particular, since operations until forming the first electrode 122 are the same as those described above with reference to FIGS. 2A to 2F, subsequent operations are described.

In an operation illustrated in FIG. 10B, an amorphous silicon film mixed with, as an impurity, a pentavalent element, e.g., phosphorus, is formed as the impurity semiconductor film 123' of first conductivity type by plasma CVD to cover the insulating members 121 and the first electrodes 122. In this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. That structure may prevent scattering of the organic material and mixing of the organic material into the impurity semiconductor film of first conductivity type. The impurity semiconductor film 123' is then partly removed by dry etching with the use of a mask illustrated in FIG. 10A, thereby forming the impurity semiconductor layer 123. The pixel isolation by the dry etching is performed above each of the insulating members 121. Therefore, the insulating member 121 functions as an etching stopper layer, and the interlayer insulating layer 120 is not exposed to the species of the dry etching. Thus, contamination of the impurity semiconductor layer 123 by the organic material may be prevented.

Next, in an operation illustrated in FIG. 10D, an amorphous silicon film becoming the semiconductor layer 124a is formed by plasma CVD to cover the insulating member 121 and the impurity semiconductor layer 123. Further, an amorphous silicon film mixed with, as an impurity, a trivalent element, e.g., boron, which film becomes the impurity semiconductor film 125a of second conductivity type, is formed by plasma CVD. In the case of providing the semiconductor layer 160 illustrated in FIG. 9C, it is beneficial that, when the amorphous silicon film is formed, the amorphous silicon film is first formed in a thickness of about 5 nm at a higher hydrogen concentration and is further formed at a lower hydrogen concentration. Then, an electroconductive film made of Al, for example, which becomes the electrode wiring 14, is formed by sputtering to cover the impurity semiconductor layer 125. Further, the electroconductive film is subjected to wet etching by using a mask illustrated in FIG. 10C, thereby forming the electrode wiring 14.

Next, the second electrode 126a made of a transparent conductive oxide is formed by sputtering to cover the impurity semiconductor film 125' and the electrode wiring 14. Further, the passivation layer 155 is formed to cover the second electrode 126a, whereby the structure illustrated in FIG. 9A is obtained.

Sixth Embodiment

Figure 11A:
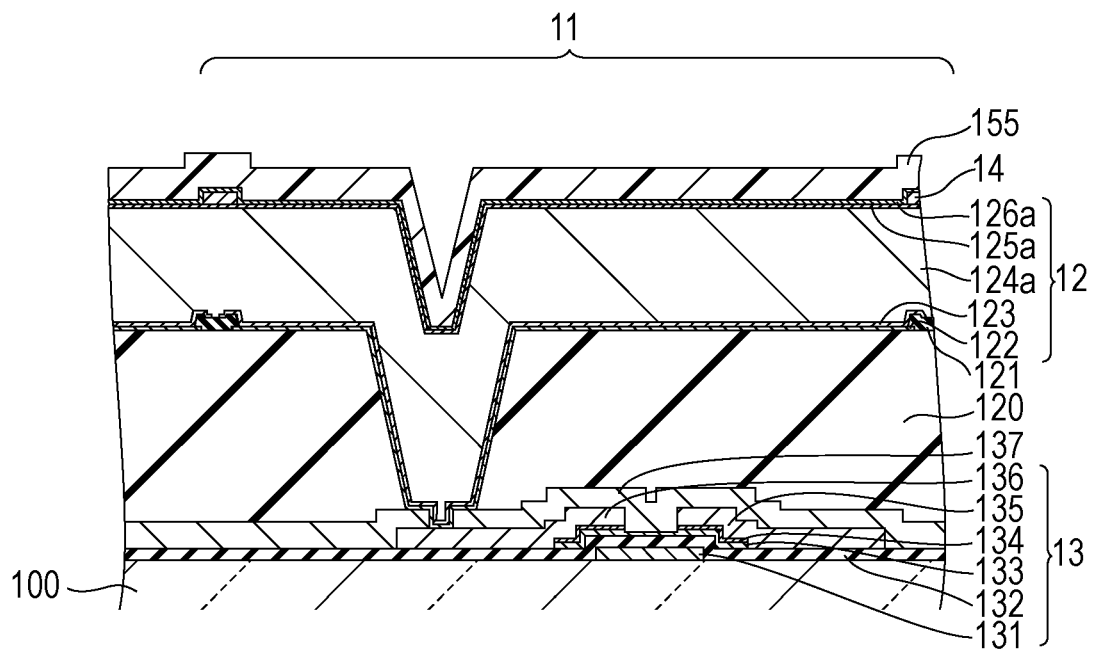
FIG. 11A is a sectional view, per pixel, of a detection device according to a sixth embodiment.
Figure 11B:
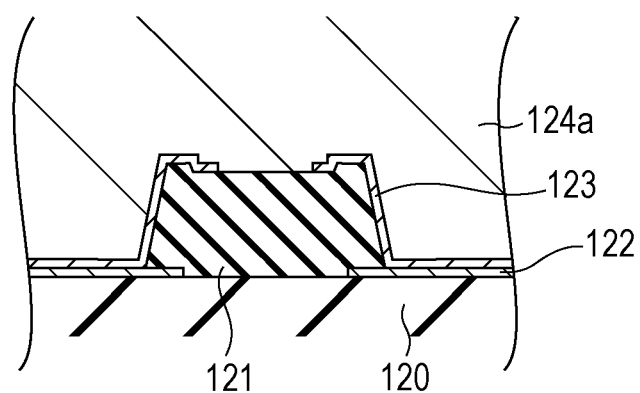
FIG. 11B is an enlarged view of a portion between pixels in FIG. 11A.

The structure of one pixel in a detection device according to a sixth embodiment will be described with reference to FIGS. 11A and 11B. FIG. 11A is a sectional view taken along a line corresponding to the line A-A' in FIG. 1A, and FIG. 11B is an enlarged view of a pixel end portion (i.e., a portion between pixels). The same components in the sixth embodiment as those described above in the foregoing embodiments are denoted by the same reference symbols and detailed description of those components is omitted.

In the third embodiment, the semiconductor layer 124, the impurity semiconductor layer 125, and the second electrode 126 are separated per pixel. On the other hand, in the sixth embodiment, a semiconductor layer 124a, an impurity semiconductor layer 125a, and a second electrode 126a are each not separated per pixel as illustrated in FIG. 11A. Because the first electrode 122 and the impurity semiconductor layer 123 are each separated per pixel, the conversion element 12 is individualized for each first electrode 122. With the structure of the sixth embodiment, therefore, an aperture ratio may be increased in comparison with that in the third embodiment. Further, since the second electrode 126a is not separated per pixel, the electrode wiring 14 that is a component reducing the aperture ratio may be dispensed with. However, when the resistance is too high with the presence of only the second electrode 126a, it is more beneficial to provide the electrode wiring 14 as well. In such a case, since the semiconductor layer 124a and the second electrode 126a are each not separated per pixel, the electrode wiring 14 may be disposed at a position where the orthographically-projected image of the electrode wiring 14 overlaps with the insulating member 121, and the electrode wiring 14 may be disposed without reducing the aperture ratio.

A manufacturing method in the sixth embodiment is similar to the operations of FIGS. 7B, 7D and 7F, described above in the third embodiment, until the operation of forming the insulating member 121, and operations subsequent to the operation of forming the impurity semiconductor layer 123 are similar to the operations described above in the fifth embodiment. Hence detailed description of the manufacturing method in the sixth embodiment is omitted.

Seventh Embodiment

Figure 12A:
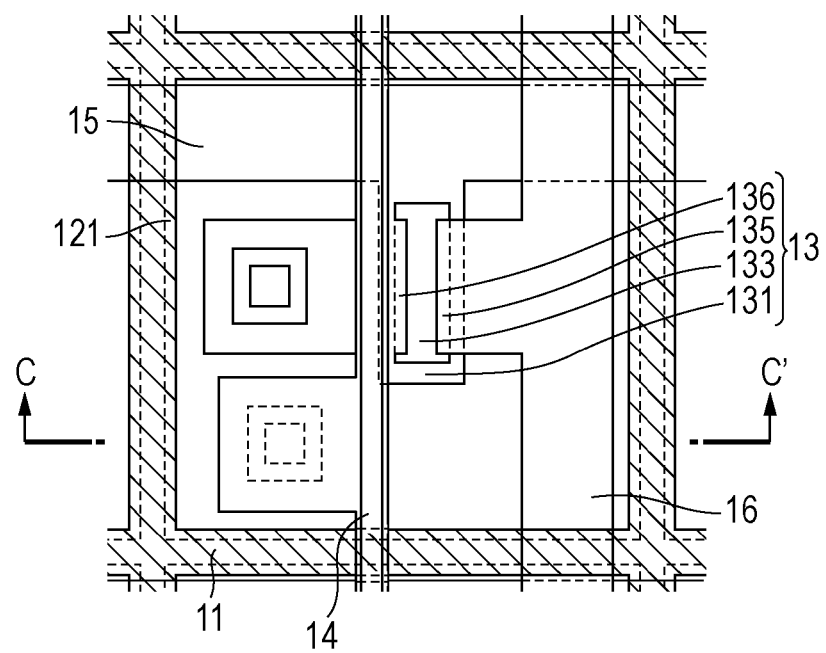
FIG. 12A is a plan view, per pixel, of the detection device according to a seventh embodiment.
Figure 12B:
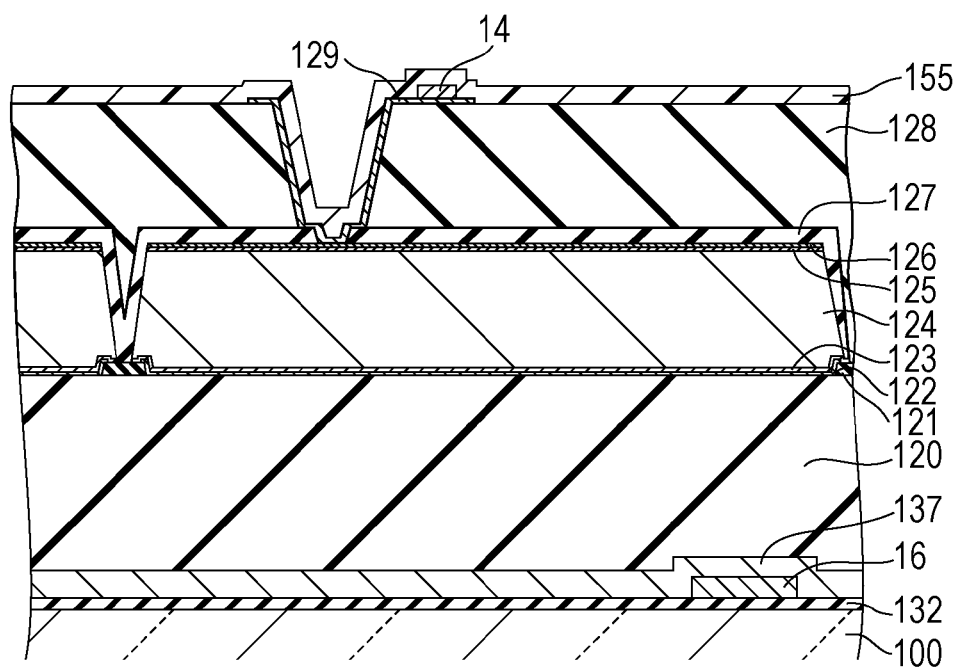
FIGS. 12B and 12C are sectional views of the detection device according to the seventh embodiment and a modification thereof.

The structure of one pixel in a detection device according to a seventh embodiment will be described below with reference to FIGS. 12A and 12B. FIG. 12A is a plan view, per pixel, of the detection device, and FIG. 12B is a sectional view taken along a line C-C' in FIG. 12A. The same components in the seventh embodiment as those described above in the foregoing embodiments are denoted by the same reference symbols and detailed description of those components is omitted.

In the foregoing embodiments, the electrode wiring 14 is directly connected to the second electrode 126 of the conversion element 12. On the other hand, in the seventh embodiment, the electrode wiring 14 is electrically connected to the second electrode 126, as illustrated in FIG. 12B, through respective contact holes of an insulating layer 127 and an interlayer insulating layer 128, which are disposed on the second electrode 126. Such a structure enables the electrode wiring 14 to be formed after forming the conversion element 12. In the second and fourth embodiments, when forming the conversion element 12, the conversion element 12 is individualized through the two operations of forming the impurity semiconductor film 123 of first conductivity type, and then forming the semiconductor layer 124 and impurity semiconductor film 125 of second conductivity type. On the other hand, in the seventh embodiment, the conversion element 12 may be individualized by successively forming the impurity semiconductor film 123', the semiconductor film 124', and the impurity semiconductor film 125', and then successively dry-etching those films. By successively forming the impurity semiconductor film 123', the semiconductor film 124', and the impurity semiconductor film 125', a conversion element may be obtained in which crystal states at respective interfaces between the impurity semiconductor layer 123 and the semiconductor layer 124 and between the semiconductor layer 124 and the impurity semiconductor layer 125 are more satisfactory.

A method of manufacturing the detection device according to the seventh embodiment will be described below with reference to FIGS. 13A to 13J. FIGS. 13A, 13C, 13E, 13G and 13I are schematic plan views of mask patterns of photomasks used in successive operations. FIGS. 13B, 13D, 13F, 13H and 13J are schematic sectional views, taken at a position corresponding to the line C-C' in FIG. 12A, in the successive operations. Detailed description of the same operations as those described in the foregoing embodiments is omitted. In particular, since operations until forming the first electrode 122 are the same as those described above with reference to FIGS. 2A to 2F, subsequent operations are described.

Figure 13A:
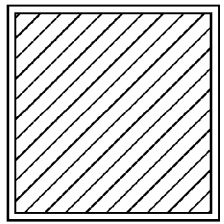
FIGS. 13A, 13C, 13E, 13G and 13I illustrate mask patterns to explain a method of manufacturing the detection device according to the seventh embodiment.
Figure 13B:
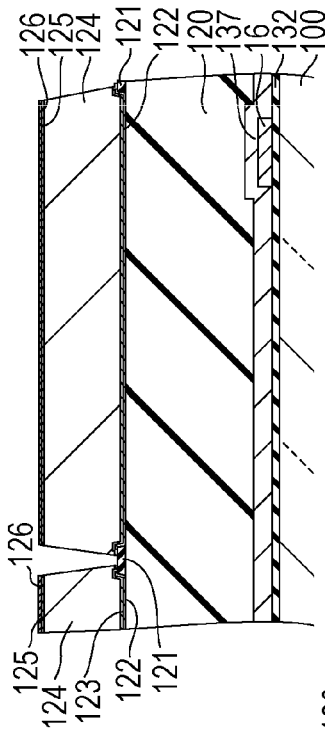
FIGS. 13B, 13D, 13F, 13H and 13J are sectional views to explain the method of manufacturing the detection device according to the seventh embodiment.
Figure 13C:
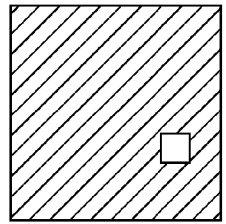

In an operation illustrated in FIG. 13B, an amorphous silicon film mixed with, as an impurity, a pentavalent element, e.g., phosphorus, is formed as the impurity semiconductor film 123' of first conductivity type by plasma CVD to cover the insulating members 121 and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. In this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. That structure may prevent scattering of the organic material and mixing of the organic material into the impurity semiconductor film of first conductivity type. Next, a transparent conductive oxide film is formed by sputtering to cover the impurity semiconductor film 125'. The transparent conductive oxide film is then subjected to wet etching by using a mask illustrated in FIG. 13A, thereby forming the second electrode 126 of the conversion element 12. Further, the conversion element 12 is isolated per pixel by removing the impurity semiconductor film 125', the semiconductor film 124', and the impurity semiconductor film 123' with dry etching using the same mask as that illustrated in FIG. 13A. The isolated conversion element 12 includes the impurity semiconductor layer 125, the semiconductor layer 124, and the impurity semiconductor layer 123 therein.

Figure 13D:
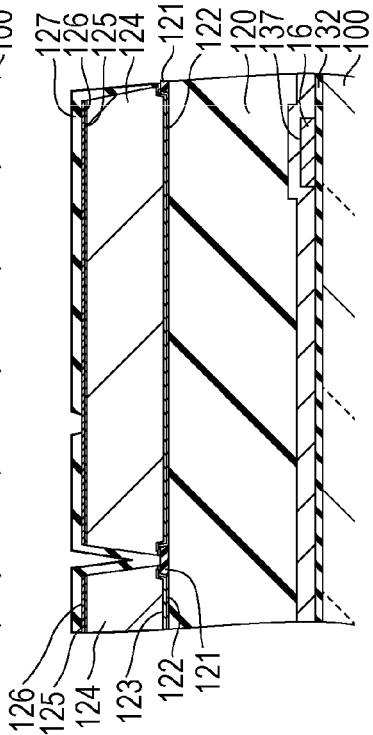
Figure 13E:
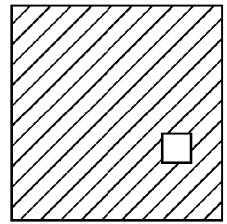

Next, in an operation illustrated in FIG. 13D, an insulating film made of an inorganic material, e.g., a silicon nitride film, is formed by plasma CVD to cover the conversion elements 12 and the insulating members 121. When that insulating film is formed, the interlayer insulating layer 120 is not exposed and contamination of the surrounding layers by the organic material may be prevented. The insulating film is then subjected to dry etching by using a mask illustrated in FIG. 13C, thereby forming the insulating layer 127.

Figure 13F:
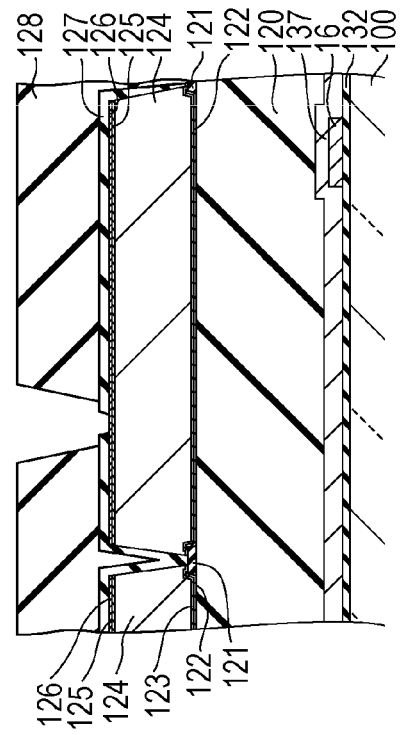
Figure 13G:
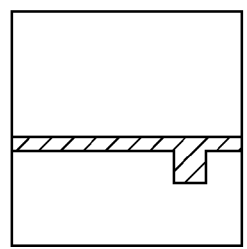

Next, in an operation illustrated in FIG. 13F, an acryl resin as an organic material having photosensitivity is formed as an interlayer insulating film to cover the second electrodes 126 and the insulating layer 127. The interlayer insulating layer 128 having a contact hole is then formed by using a mask illustrated in FIG. 13E.

Figure 13H:
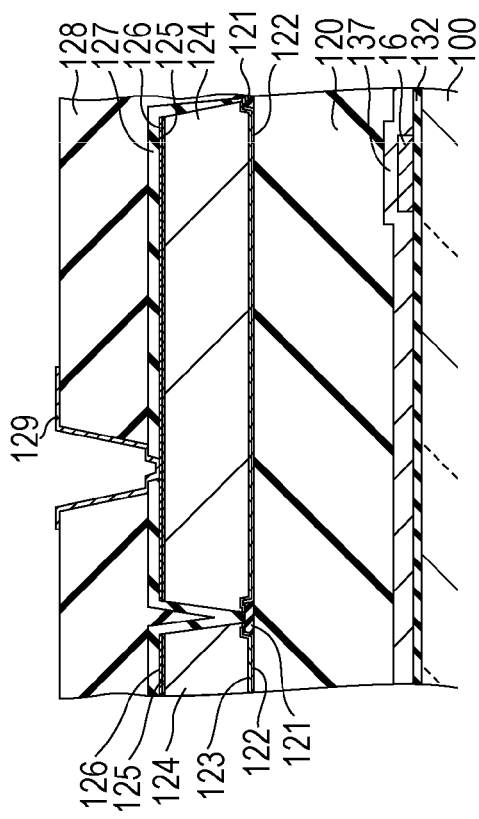
Figure 13I:
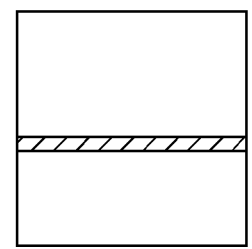

Next, in an operation illustrated in FIG. 13H, a transparent conductive oxide film is formed by sputtering. The transparent conductive oxide film is then subjected to wet etching by using a mask illustrated in FIG. 13G, thereby forming an electroconductive layer 129.

Figure 13J:
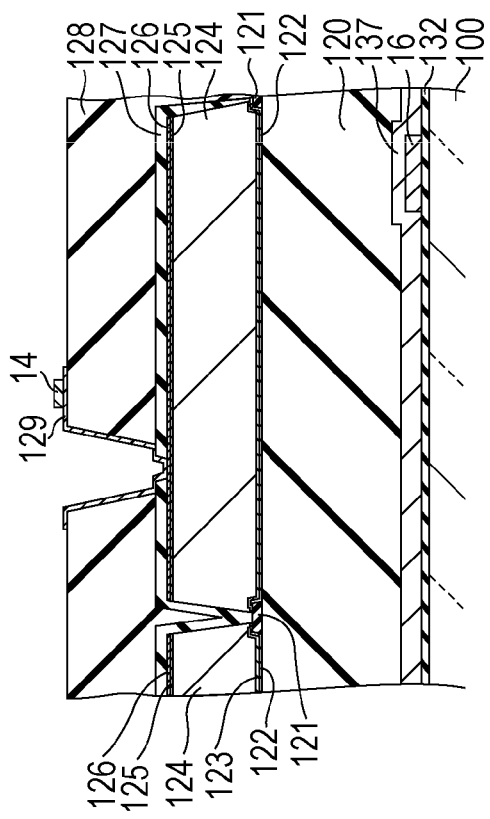

Next, in an operation illustrated in FIG. 13J, an electroconductive film made of Al, for example, which becomes the electrode wiring 14, is formed by sputtering. Further, the electroconductive film is subjected to wet etching by using a mask illustrated in FIG. 13I, thereby forming the electrode wiring 14. With that operation, the electrode wiring 14 and the second electrode 126 of the conversion element 12 are electrically connected to each other through the electroconductive layer 129. On that occasion, a reduction of the aperture ratio may be suppressed by using the transparent conductive oxide to form the electroconductive layer 129.

Then, the passivation layer 155 is formed to cover the electrode wiring 14, the electroconductive layer 129, and the interlayer insulating layer 128, whereby the structure illustrated in FIG. 12B is obtained.

Figure 12C:
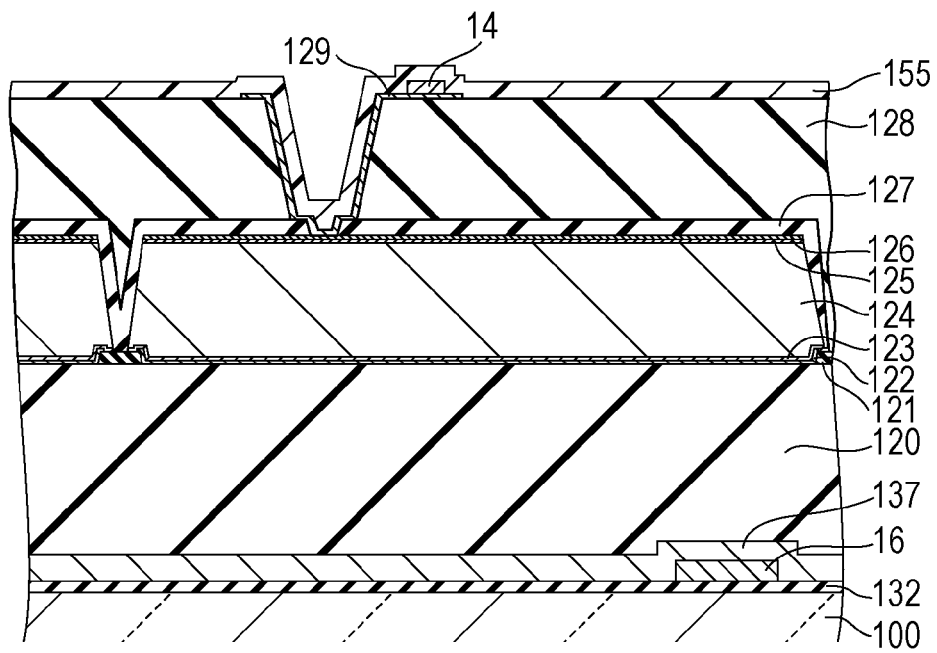

While the above-described structure between the pixels in the seventh embodiment is similar to that in the second embodiment, the seventh embodiment may be modified to have a similar structure to that in the fourth embodiment without problems. In such a case, a structure illustrated in FIG. 12C is obtained at a section taken along the line C-C' in FIG. 12A.

Figure 12D:
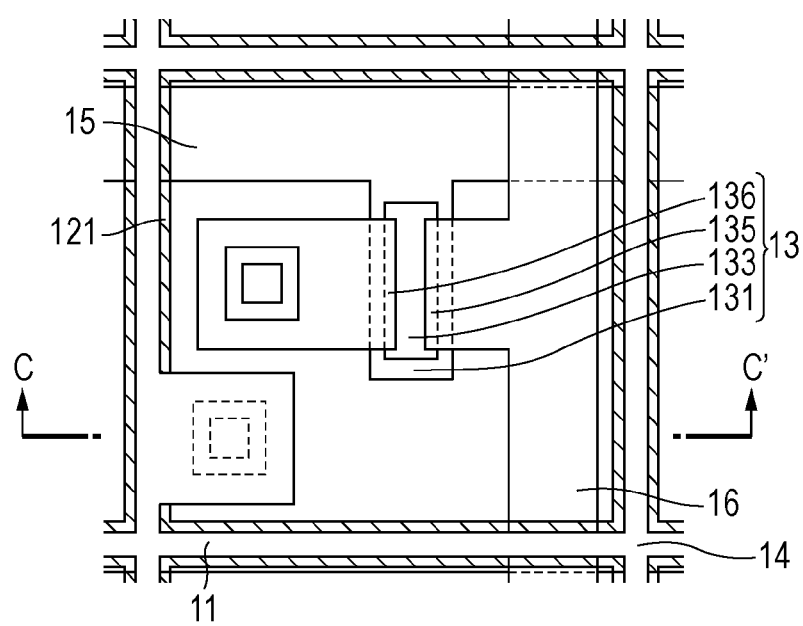
FIG. 12D is a plan view, per pixel, of another modification of the detection device according to the seventh embodiment.

Moreover, as illustrated in FIG. 12D, the electrode wiring 14 may be disposed between the pixels. In such a case, since the electrode wiring 14 made of Al, for example, is disposed between the pixels, the electrode wiring 14 may be provided without reducing the aperture ratio. Since the electrode wiring 14 functions as a grid, the MTF (Modulation Transfer Function) may be improved. Since the bias potential Vs may be supplied not only in the vertical direction as viewed in the drawing sheet, but also in the left and right direction, generation of image non-uniformity, etc. attributable to a delay in supply of the bias potential may be prevented.

Application Example

Figure 14:
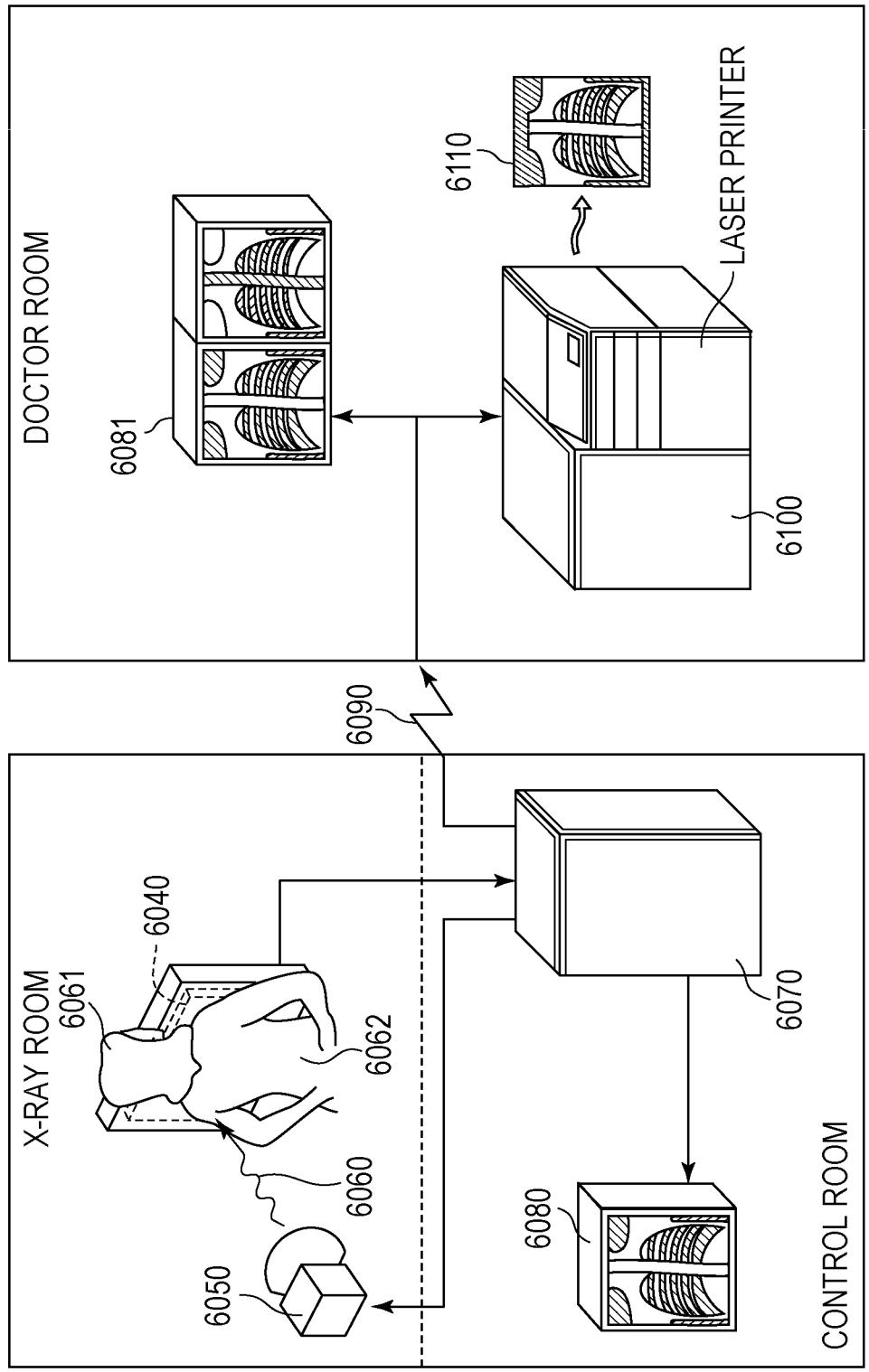
FIG. 14 is a conceptual view of a radiation detection system using the detection device according to an embodiment.

A radiation detection system using the detection device according to the embodiment will be described below with reference to FIG. 14.

An X-ray 6060 generated by an X-ray tube 6050, as a radiation source, passes through the chest 6062 of a patient or examinee 6061 and enters the conversion elements 12 in the conversion section 3 (see FIG. 3) that is included in a radiation detection device 6040. The X-ray incident on the conversion elements 12 includes information regarding the inside of the body of the patient 6061. Upon the incidence of the X-ray, the radiation is converted to electric charges in the conversion section 3, to thereby obtain electrical information. The electrical information is converted to digital data and is subjected to image processing in an image processor 6070, which is an example of a signal processing unit, such that the information may be observed on a display 6080, which is an example of a display unit, in a control room.

The obtained information may be transferred to a remote place through a transmission processing unit, e.g., a telephone line 6090, or may be displayed on a display 6081, which is another example of the display unit, or stored in a recording unit, e.g., an optical disk, in a doctor room, etc. at another location such that a doctor at the remote place or in the doctor room may make diagnosis. Alternatively, the obtained information may also be recorded on a film 6110 as a recording medium by a film processor 6100, which is another example of the recording unit.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2011-122015 filed May 31, 2011 and No. 2011-209461 filed Sep. 26, 2011, which are hereby incorporated by reference herein in their entirety.

What is claimed is:

1. A method of manufacturing a detection device including a plurality of pixels arrayed on a substrate, the pixels each including a switch element disposed on the substrate and a conversion element including an impurity semiconductor layer and a semiconductor layer, wherein the impurity semiconductor layer is disposed in direct contact with an electrode and has a concentration of impurities higher than a concentration of impurities in the semiconductor layer, wherein the semiconductor layer is disposed in direct contact with and above the impurity semiconductor layer, wherein the electrode is disposed above the switch element and isolated per pixel and joined to the switch element, and further including an interlayer insulating layer, which is made of an organic material, which is disposed between the substrate and the plurality of electrodes, and which covers the switch elements, the method comprising: forming the electrodes in contact with the interlayer insulating layer, and insulating members each made of an inorganic material and disposed to cover the interlayer insulating layer between adjacent two of the electrodes; and forming an impurity semiconductor film that covers the insulating members and the electrodes, and that becomes the impurity semiconductor layer.

2. The method of manufacturing the detection device according to claim 1, wherein forming the electrodes comprises forming an insulating film made of the inorganic material and covering the interlayer insulating layer, and forming the insulating members from the insulating film, and forming a transparent conductive oxide film that covers the interlayer insulating layer and the insulating members, and forming the electrodes from the transparent conductive oxide film.

3. The method of manufacturing the detection device according to claim 1, wherein forming the electrodes comprises forming a transparent conductive oxide film that covers the interlayer insulating layer, and forming the electrodes from the transparent conductive oxide film, and forming an insulating film made of the inorganic material and covering the interlayer insulating layer and the electrodes, and forming the insulating members from the insulating film.

4. The method of manufacturing the detection device according to claim 1, further comprising removing a part of the impurity semiconductor film above the insulating member, thereby forming the impurity semiconductor layer.

5. The method of manufacturing the detection device according to claim 4, wherein forming an impurity semiconductor film further includes forming a semiconductor film that covers the impurity semiconductor film.

6. The method of manufacturing the detection device according to claim 5, wherein removing a part of the impurity semiconductor film comprises removing a part of the impurity semiconductor film and a part of the semiconductor film above the insulating member, thereby forming the impurity semiconductor layer from the impurity semiconductor film and a semiconductor layer of the conversion element from the semiconductor film, respectively.

7. The method of manufacturing the detection device according to claim 4, wherein removing a part of the impurity semiconductor film further includes forming a semiconductor film that covers the impurity semiconductor layer.

8. The method of manufacturing the detection device according to claim 7, wherein removing a part of the impurity semiconductor film comprises removing the impurity semiconductor film and the semiconductor film above the insulating member, thereby forming the impurity semiconductor layer from the impurity semiconductor film and a semiconductor layer of the conversion element from the semiconductor film, respectively.

9. The method of manufacturing the detection device according to claim 7, further comprising, prior to forming the aforesaid semiconductor film, forming a semiconductor film having a higher hydrogen concentration than the aforesaid semiconductor film.

10. The method of manufacturing the detection device according to claim 8, further comprising:
forming an impurity semiconductor film having a conductivity type different from that of the aforesaid impurity semiconductor layer and covering the semiconductor film;
forming an electroconductive film that covers the impurity semiconductor film of the different conductivity type, and that becomes an opposite electrode of the conversion element, wherein the opposite electrode differs from the aforesaid electrode; and
forming an electrode wiring joined to the electroconductive film such that a part of an orthographically-projected image of the electrode wiring overlaps with the insulating member.

11. A detection device comprising: a substrate; a plurality of pixels arrayed on the substrate, the pixels each including a switch element disposed on the substrate and a conversion element including an impurity semiconductor layer and a semiconductor layer, wherein the impurity semiconductor layer is disposed in direct contact with an electrode and has a concentration of impurities higher than a concentration of impurities in the semiconductor layer, wherein the electrode is disposed above the switch element, wherein the semiconductor layer is disposed in direct contact with and above the impurity semiconductor layer, wherein the electrode is isolated per pixel, and wherein the electrode is electrically connected to the switch element; an interlayer insulating layer made of an organic material, disposed between a plurality of the switch elements and a plurality of the electrodes, and covering the switch elements; and insulating members each made of an inorganic material, disposed on the interlayer insulating layer to cover the interlayer insulating layer between adjacent two of the electrodes that are disposed on the interlayer insulating layer in contact with the interlayer insulating layer, the impurity semiconductor layer being formed by separating an impurity semiconductor film, which is formed over the insulating members and the electrodes, at a position above each of the insulating members.

12. A detection system comprising:
the detection device according to claim 11;
a signal processing unit configured to process a signal from the detection device;
a recording unit configured to record a signal from the signal processing unit;
a display unit configured to display the signal from the signal processing unit; and
a transmission processing unit configured to transmit the signal from the signal processing unit.

* * * * *